(12) United States Patent
Shin et al.

(10) Patent No.: US 10,034,399 B2
(45) Date of Patent: Jul. 24, 2018

(54) DISPLAY DEVICE

(71) Applicant: LG ELECTRONICS INC., Seoul (KR)

(72) Inventors: Donghyok Shin, Seoul (KR); Hyoungkyu Kim, Seoul (KR); Seokho Kwon, Seoul (KR); Jaegi Lee, Seoul (KR); Jihoon Yoon, Seoul (KR); Kwangho Shin, Seoul (KR); Chunsoo Chang, Seoul (KR); Jaecheol Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 87 days.

(21) Appl. No.: 15/164,547

(22) Filed: May 25, 2016

(65) Prior Publication Data

US 2017/0064851 A1    Mar. 2, 2017

Related U.S. Application Data

(60) Provisional application No. 62/211,308, filed on Aug. 28, 2015.

(30) Foreign Application Priority Data

Nov. 20, 2015  (KR) .......................... 10-2015-0163274
Nov. 20, 2015  (KR) .......................... 10-2015-0163280

(51) Int. Cl.
  *G06F 1/16*      (2006.01)
  *H05K 5/00*      (2006.01)
  (Continued)

(52) U.S. Cl.
  CPC ........... *H05K 5/0226* (2013.01); *F16M 11/04* (2013.01); *G06F 1/18* (2013.01); *G06F 1/203* (2013.01);
  (Continued)

(58) Field of Classification Search
  CPC ................ G06F 1/16; G06F 1/1601; G06F 1/18–1/189; G06F 1/203; G06F 1/206;
  (Continued)

(56) References Cited

U.S. PATENT DOCUMENTS 5,978,211 A    11/1999 Hong
6,010,111 A *   1/2000 Cho ....................... F16M 11/10
                                                      248/346.06

(Continued)

FOREIGN PATENT DOCUMENTS

EP    1939517 A2    7/2008
GB    2489289 A     9/2012

(Continued)

*Primary Examiner* — Anthony Haughton
(74) *Attorney, Agent, or Firm* — Dentons US LLP

(57) ABSTRACT

A display device is disclosed. The display device of the present invention includes: a display panel; a back cover provided to the rear side of the display panel; a first housing provided to at least part of the rear side of the back cover; a second housing, at least part of which contacts the first housing, the second housing having a main board and a power supply mounted therein; and a hinge for coupling the first housing and the second housing, wherein the second housing changes from at least one of a first state in which the second housing is extended in a direction perpendicular to the first housing and a second state in which at least one side of the second housing is extended in parallel with the rear side of the first housing to the other state, according to rotation of the hinge. Accordingly, the display device can easily switch between a standing type and a wall-mounted type by coupling the first housing and the second housing using a hinge.

20 Claims, 27 Drawing Sheets

(51) Int. Cl.
  *H05K 7/00* (2006.01)
  *H05K 5/02* (2006.01)
  *F16M 11/04* (2006.01)
  *G06F 1/18* (2006.01)
  *G06F 1/20* (2006.01)

(52) U.S. Cl.
  CPC ............ *G06F 1/206* (2013.01); *H05K 5/0017* (2013.01); *E05Y 2900/606* (2013.01)

(58) Field of Classification Search
  CPC .. H05K 5/0226; H05K 5/0017; H05K 5/0204; H05K 5/0217; H05K 5/0221; H05K 5/0234
  USPC ................ 361/679.21–679.3, 679.5, 679.56, 361/724–727; 312/223.1–223.3
  See application file for complete search history.

(56) References Cited

U.S. PATENT DOCUMENTS

| | | | |
|---|---|---|---|
| 6,268,998 B1 * | 7/2001 | Cho | ........................ G06F 1/1601 |
| | | | 248/917 |
| 6,502,792 B1 * | 1/2003 | Cho | ........................ F16M 11/10 |
| | | | 248/121 |
| 7,567,436 B2 * | 7/2009 | Jeong | ..................... F16M 11/10 |
| | | | 16/221 |
| 9,280,179 B2 * | 3/2016 | Morrison | .............. G06F 1/1626 |
| 9,588,550 B2 * | 3/2017 | Smith | ................... G06F 1/1613 |
| 2003/0024073 A1 | 2/2003 | Chih et al. | |
| 2009/0151116 A1 | 6/2009 | Lin | |
| 2010/0096515 A1 | 4/2010 | Hazzard et al. | |
| 2011/0154613 A1 | 6/2011 | Chang | |
| 2014/0043738 A1 | 2/2014 | Hirasawa | |

FOREIGN PATENT DOCUMENTS

| | | |
|---|---|---|
| KR | 1020060008537 A | 1/2006 |
| KR | 100778217 B1 | 11/2007 |

* cited by examiner

FIG. 1
(a)
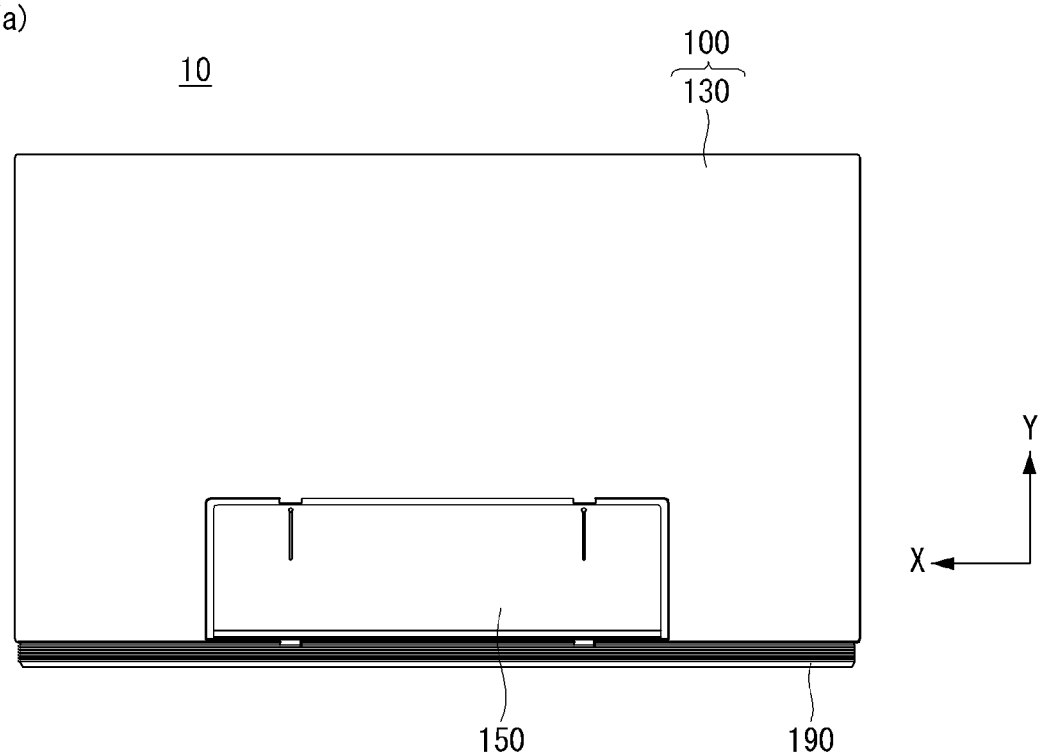
(b)
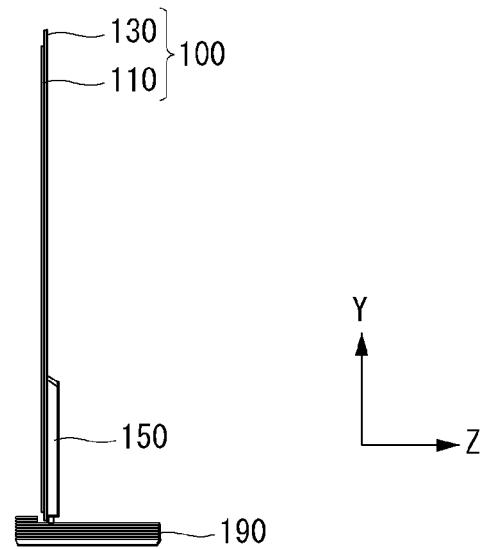

FIG. 3
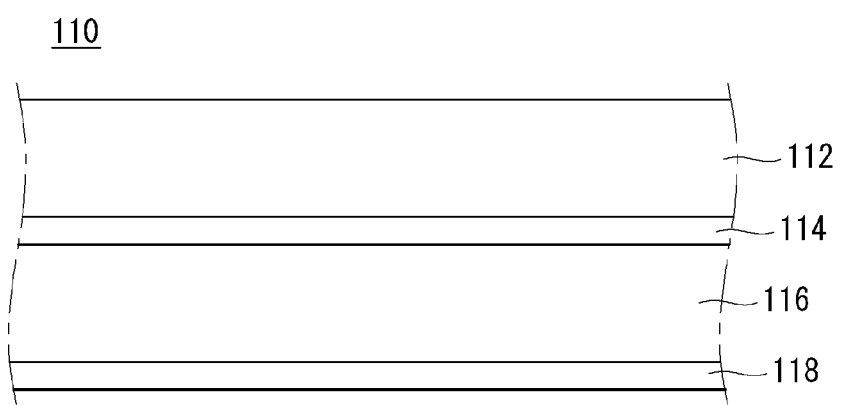
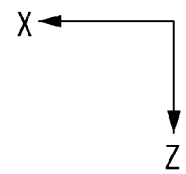

FIG. 5
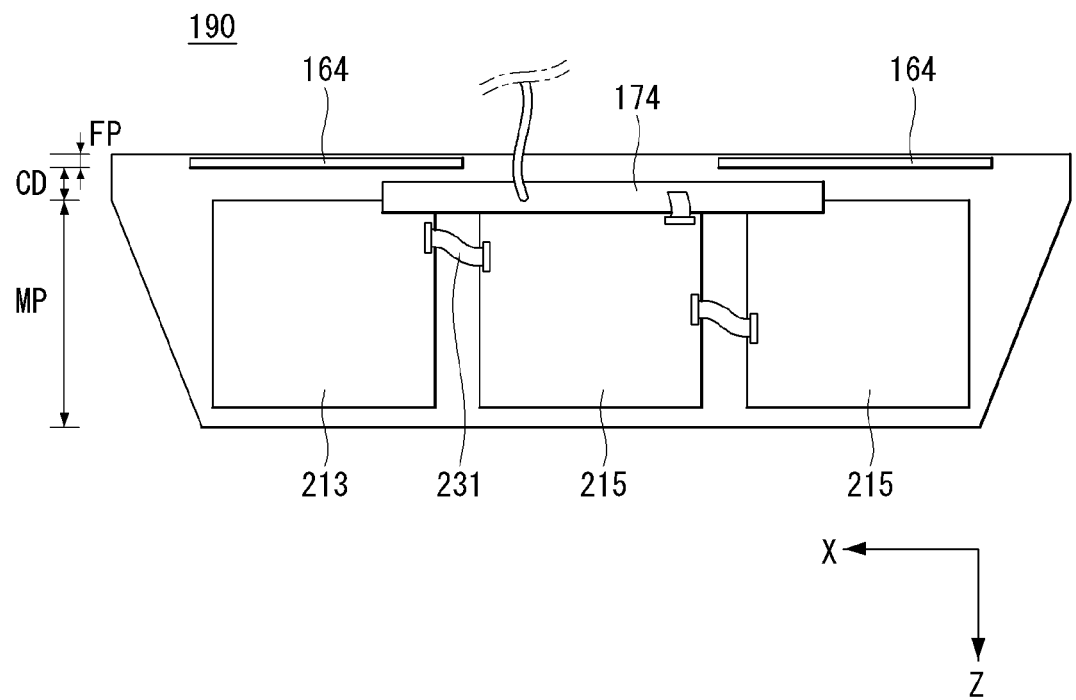
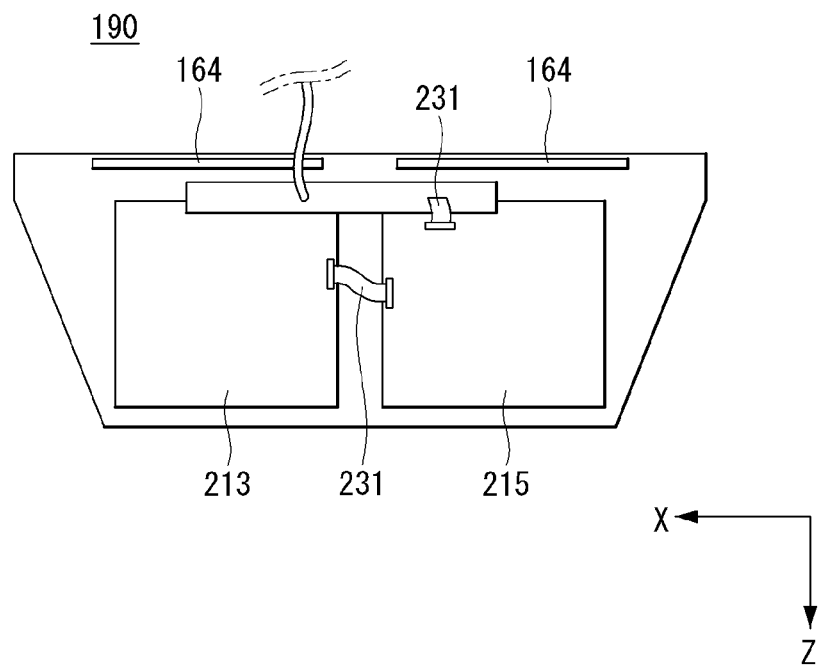

FIG. 7
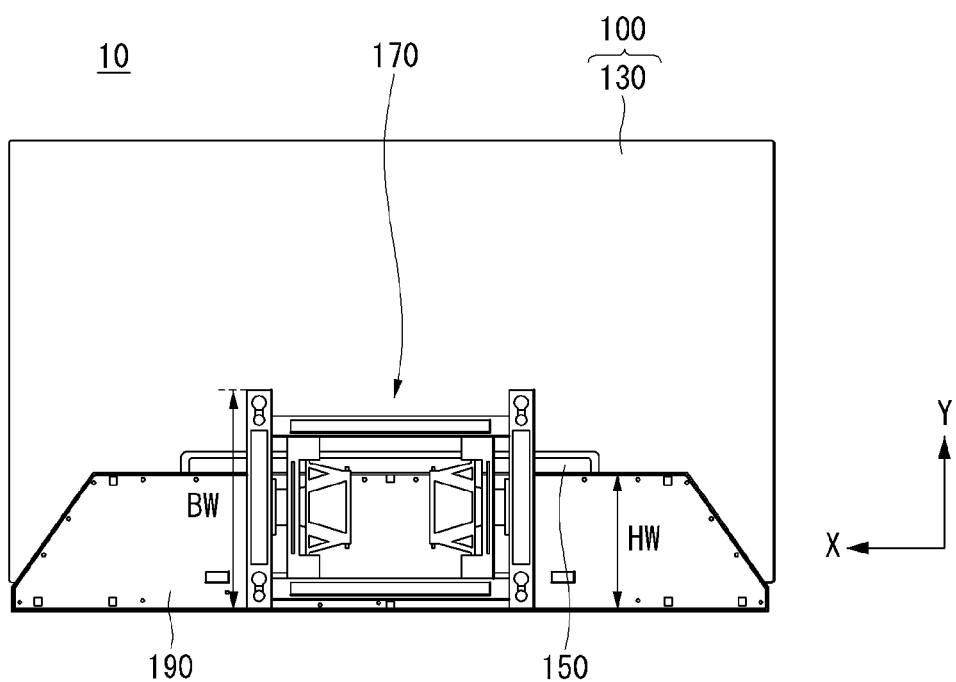
(a)
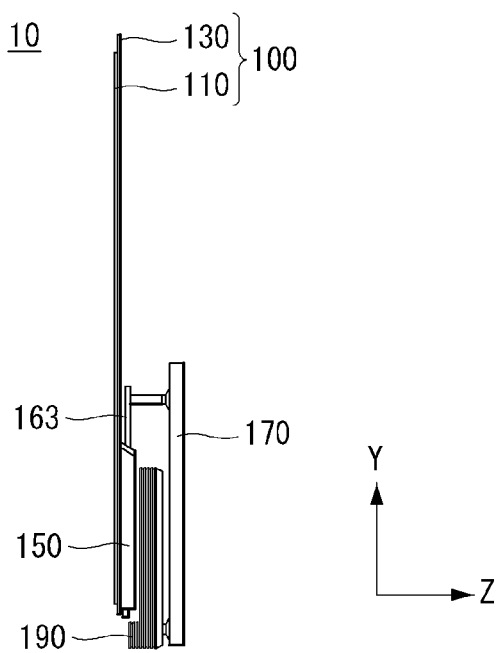
(b)

FIG. 21
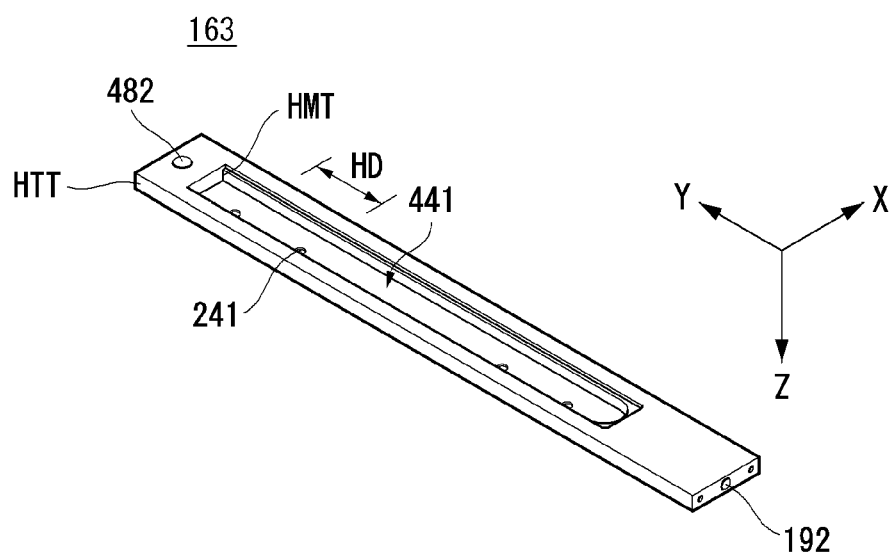
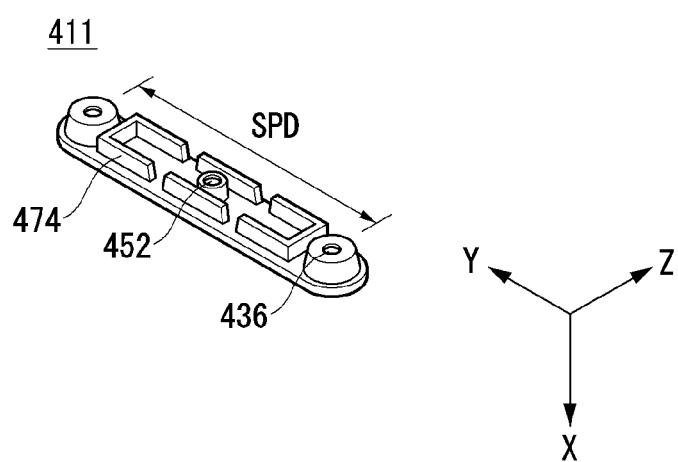

FIG. 23
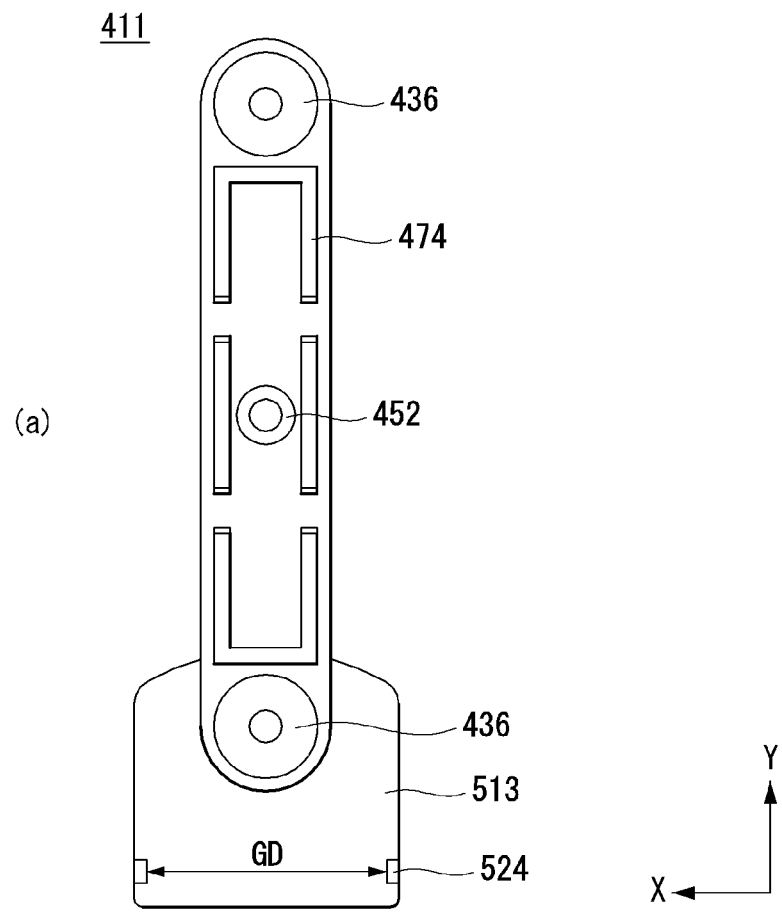
(a)
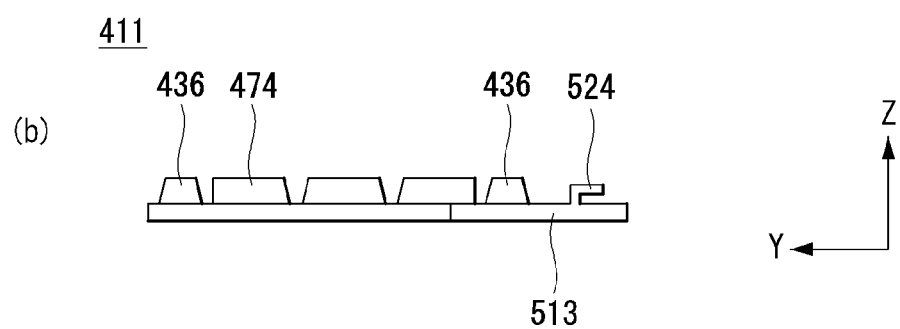
(b)

FIG. 27
(a) 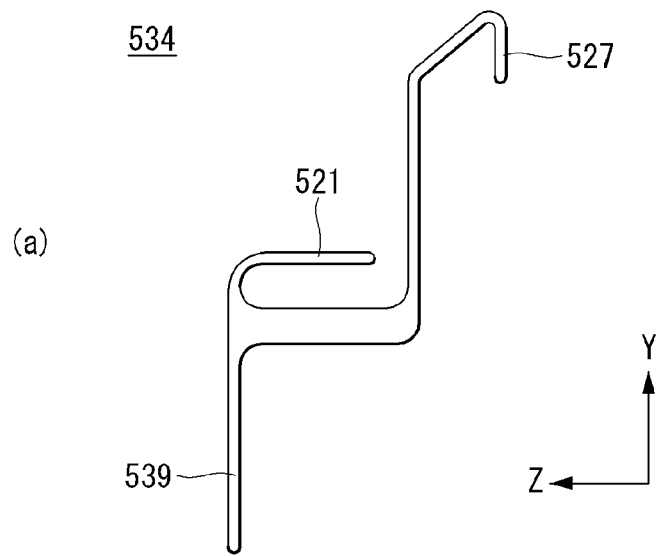
(b) 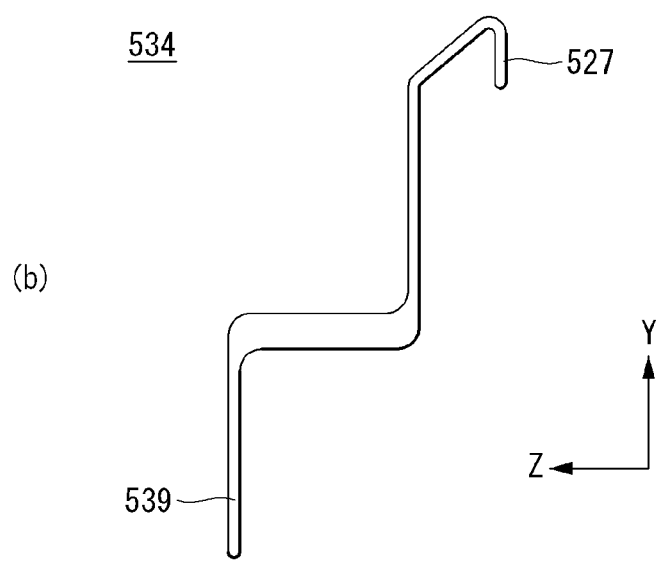

DISPLAY DEVICE

This application claims the benefit of Korean Patent Application Nos. 10-2015-0163274 filed on Nov. 20, 2015, 10-2015-0163280 filed on Nov. 20, 2015, and U.S. Provisional Application No. 62/211,308 filed on Aug. 28, 2015, the entire contents of which is hereby incorporated by reference in its entirety.

BACKGROUND OF THE DISCLOSURE

Field of the Disclosure

The present invention relates to a display device and, more particularly, to a display device which can be easily changed to a stand type or a wall-mounted type by coupling a first housing and a second housing through a hinge.

Background of the Disclosure

With the development of information-oriented society, demand for display devices is increasing. To meet such demand, various types of display devices such as an LCD (Liquid Crystal Display), PDP (Plasma Display Panel), ELD (electroluminescent display) and VFD (Vacuum Fluorescent Display) have recently been researched and used.

From among such display devices, display devices using an organic light emitting diode (OLED) can be implemented as ultra-thin displays since the display devices have excellent luminance and viewing angle characteristics and do not require a backlight unit, compared to LCDs.

SUMMARY OF THE DISCLOSURE

According to an aspect of the present invention, there is provided a display device, including: a display panel; a back cover provided to the rear side of the display panel; a first housing provided to at least part of the rear side of the back cover; a second housing, at least part of which contacts the first housing, the second housing having a main board and a power supply mounted therein; and a hinge for coupling the first housing and the second housing, wherein the second housing changes from at least one of a first state in which the second housing is extended in a direction perpendicular to the first housing and a second state in which at least one side of the second housing is extended in parallel with the rear side of the first housing to the other state, according to rotation of the hinge.

The first state may be a standing state and the second state may be a wall-mounted state.

The hinge may include a first area and a second area covering at least part of the first area.

The second housing may change the state thereof as the second area rotates around the first area.

The second area may rotate around the first area counterclockwise when the first state changes to the second state.

The second area may be extended in parallel with the first area in the first state and extended in a direction perpendicular to the first area in the second state.

The first area may be coupled to the first housing and the second area may be coupled to the second housing.

The first area may include a cylindrical hinge bar disposed at a region coupled to the second area, and the second area may rotate about the hinge bar.

The second area may include an inserted part at one end thereof, the inserted part protruding to the second area, wherein the inserted part is inserted into an insertion hole formed at one side of the hinge bar in the first state and separated from the insertion hole in the second state.

The inserted part may be separated from the insertion hole as a spring inserted into the second area contracts, when the first state changes to the second state.

The second area may include a rail part protruding to the side thereof and provided to one end thereof, and the rail part may be inserted into a guide groove formed in the hinge bar, the guide groove having a diameter greater than other portions of the hinge bar.

The guide groove may be formed in the direction of the front side of the hinge bar between 0 to 90 degrees counterclockwise.

The hinge may include a first hinge and a second hinge respectively coupled to both sides of the second housing.

At least part of the hinge may include a convexo-concave part.

The display device may further include a through bolt for simultaneously coupling and fixing the first housing and the second housing in the first state.

The through bolt may include a first screw region and a second screw region having different diameters.

The first screw region may engage with at least one hole of the second housing and the second screw region may engage with at least one hole of the first housing.

The display device may further include a locking bracket for simultaneously coupling and fixing the first housing and the second housing in the second state.

The hinge may include a metal material.

The back cover may include a transparent material.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 1 to 5 illustrate a configuration of a display device related to the present invention; and FIGS. 6 to 27 illustrate a display device according to an embodiment of the present invention.

DETAILED DESCRIPTION OF THE EMBODIMENTS

Figure 2:
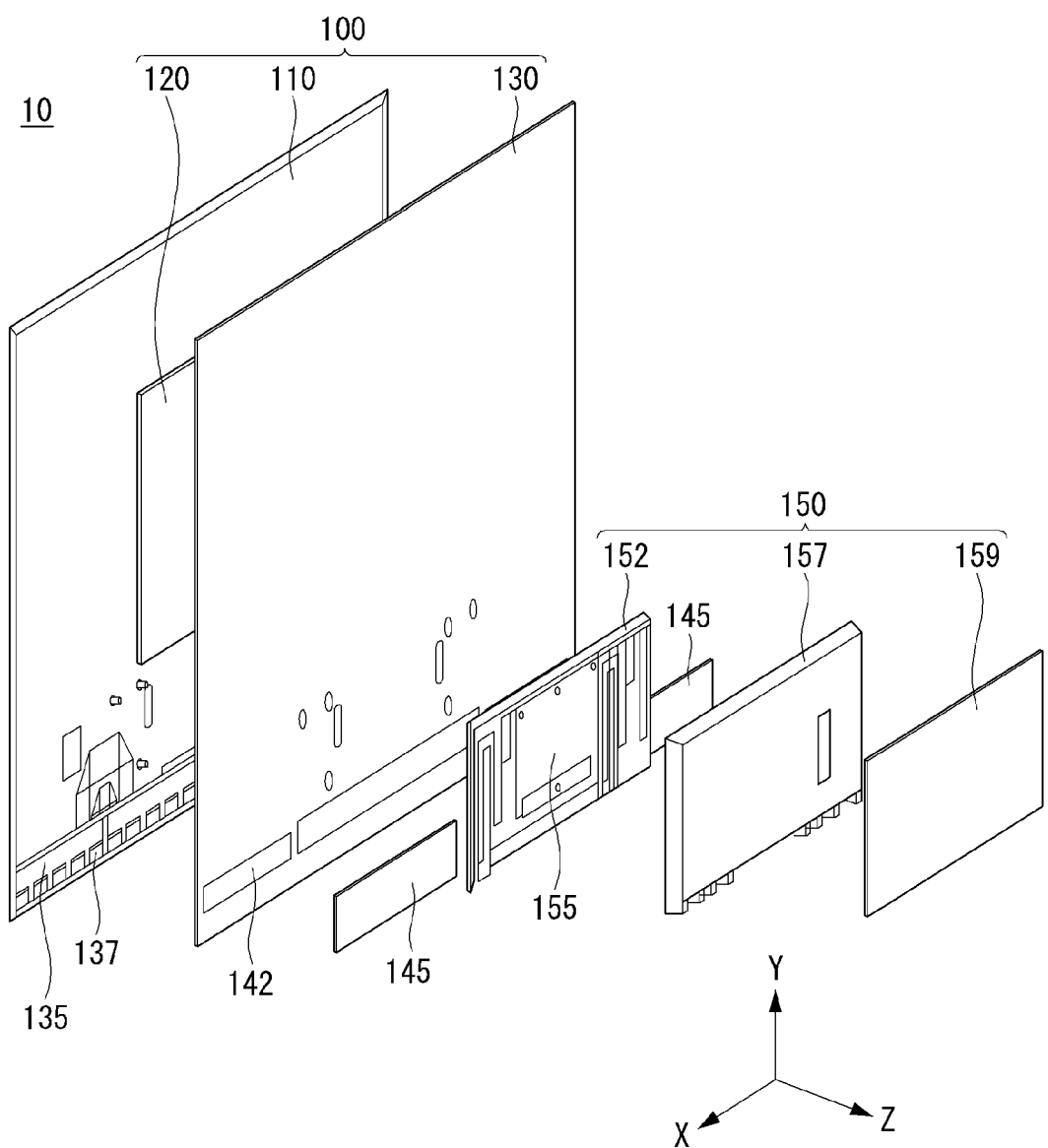

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

While an organic light emitting display (OLED) is exemplified as a display panel in the following description, a display panel applicable to the present invention is not limited to the OLED panel and may be an LCD, PDP or FED (Field Emission Display) panel.

In the following description, a display panel may include a first long side LS1, a second long side LS2 opposite the first long side LS1, a first short side SS1 adjoining the first long side LS1 and the second long side LS2, and a second short side SS2 opposite the first short side SS1.

The area of the first short side SS1 may be referred to as a first side area, the area of the second short side SS2 may be referred to as a second side area opposite the first side area, the area of the first long side LS1 may be referred to as a third side area adjoining the first side area and the second side area and located between the first side area and the second side area, and the area of the second long side LS2 may be referred to as a fourth side area opposite the third side area, which adjoins the first side area and the second side area and is located between the first side area and the second side area.

While the length of the first and second long sides LS1 and LS2 is greater than the length of the first and second short sides SS1 and SS2 in the figure, the length of the first and second long sides LS1 and LS2 may be approximately equal to the length of the first and second short sides SS1 and SS2.

In the following description, a first direction DR1 may be parallel with the long sides LS1 and LS2 of the display panel 100 and a second direction DR2 may be parallel with the short sides SS1 and SS2 of the display panel 100.

A third direction DR3 may be perpendicular to the first direction DR1 and/or the second direction DR2.

The first direction DR1 and the second direction DR2 may be commonly referred to as a horizontal direction.

The third direction DR3 may be referred to as a vertical direction.

FIGS. 1 to 5 illustrate a configuration of a display device related to the present invention.

Referring to FIG. 1, a display device 10 according to the present invention may include a module 100, a first housing 150 and a second housing 190.

The module 100 may form the body of the display device 10. The module 100 may have a rectangular shape. However, the shape of the module 100 is not limited thereto and may have a shape with corners having a predetermined curvature. The module 100 may include a back cover 130 provided to the rear side of a display panel 110. The back cover 130 may be equal to or larger than the display panel in size. The back cover 130 can support the rear side of the display panel 110.

Components of the module 100 and functions thereof will be described in detail later.

The first housing 150 may be provided to at least part of the rear side of the module 100. The first housing 150 can support the lower part of the module 100 such that the module 100 is not inclined in one direction. The first housing 150 can shield components of the display device 10. For example, the first housing 150 can shield at least one printed circuit board (PCB). A coupling structure and a coupling method of the PCB will be described in detail below.

The second housing 190 may be provided to the lower surface of the first housing 150. The second housing 190 may be extended in a direction perpendicular to the direction in which the module 100 and the first housing 150 are extended.

The second housing 190 can support the module 100 and the first housing 150 such that the module 100 and the first housing 150 do not fall. The second housing may be coupled to the first housing 150 without contacting the module 100. That is, the module 100 is separated from the first housing 150 by a predetermined distance. Accordingly, less impact is applied to the module 100 when the display device 10 is horizontally laid on the ground and thus the module 100 is less likely to crack.

The second housing 190 may include at least one PCB mounted therein. The at least one PCB may be disposed in a region of the second housing 190 extended to the rear side of the module 100. The width of a region of the second housing 190 extended to the front side of the module 100 may be narrower than the width of the region extended to the rear side of the module 100. Accordingly, the second housing 190 does not distract a user from viewing displayed images since only a small part of the second housing 190 is exposed to the user. A coupling structure and method of the PCB will be described in detail below.

In the display device 10 according to the present invention, PCBs, which occupy a large space, can be separately mounted in the first and second housings 150 and 190. Accordingly, the display device 10 can appear to be very thin.

Referring to FIG. 2, the module 100 may include the display panel 110, a heat diffusion plate 120 and the back cover 130.

The display panel 110 is provided to the front side of the module 100 and can display images. The display panel 110 may display an image by dividing the image into a plurality of pixels and controlling each pixel to emit light with color, brightness and saturation controlled per pixel.

The display panel 110 may be an OLED panel which is a self-emissive display. When the display panel 110 is configured as an OLED panel, a thin and light display panel 10 can be achieved. Demand for display panels employing OLEDs is increasing since consumers prefer thin and light displays. A configuration of the display panel 110 will be described in detail below.

The back cover 130 may be provided to the rear side of the display panel 110. The back cover 130 can protect the rear side of the display panel 110 by being coupled thereto. The back cover 130 may be coupled to the display panel 110 by means of a screw. The back cover 130 may be equal to or larger than the display panel in size in order to protect the entirety of the display panel 110.

The back cover 130 may be made of a transparent material. For example, the back cover 130 can be made of glass or tempered glass. Accordingly, the back cover 130 does not distract the user from the display screen.

The heat diffusion plate 120 may be located between the display panel 110 and the back cover 120. The heat diffusion plate 120 may be attached to the display panel 110 and/or the back cover 130. For example, an adhesive pad and/or a magnet can be attached to one side or both sides of the heat diffusion plate 120. The heat diffusion plate 120 may be narrower than the display panel 110 and the back cover 130 such that the heat diffusion plate 120 is not exposed to the outside.

The heat diffusion plate 120 can disperse heat generated from the module 100. That is, the heat diffusion plate 120 can prevent a specific region from having higher heat distribution than other regions. For example, the heat diffusion plate 120 can be made of a material having high thermal conductivity, such as aluminum.

A source PCB 135 and a source chip on film (COF) 137 may be provided to the lower part of the rear side of the display panel 110. The source PCB 135 includes signal lines for transmitting digital video data and timing control signals transferred from a timing controller board. The source PCB 135 can be coupled to the display panel 110 through the source COF 137.

The back cover 130 may have at least one hole 142 formed in the lower part thereof such that the source PCB 135 can be attached to the rear side of the display panel 110 through the hole 142. The at least one hole 142 may correspond to the position of the source PCB 135 when the back cover 130 is attached to the display panel 110. The back cover 130 can disperse heat emitted from the source PCB 135 through the at least one hole 142.

A source PCB cover 145 for covering the at least one hole 142 may be provided to the rear side of the back cover 130. The source PCB cover 145 can shield the source PCB 135. The source PCB cover 145 may be made of a material having high terminal conductivity, such as aluminum. Accordingly, the source PCB cover 145 can disperse heat emitted from the source PCB 135. The source PCB cover 145 may cover only holes 142 formed at both sides of the back cover 130 except for the center hole 142. That is, the source PCB cover 145 can be disposed at both sides of the first housing 150 since the center hole 142 can be covered by the first housing 150.

The first housing 150 may include a rigid plate 152 and first and second T-CON covers 157 and 159. The rigid plate 152 may be coupled to the rear side of the back cover 130 and then the first and second T-CON covers 157 and 159 may be sequentially coupled thereto.

The rigid plate 152 may be a part on which at least one PCB is mounted. The rigid plate 152 may have at least one groove formed in a region other than a region where the PCB is mounted. The at least one groove may have a form protruding to the rear side of the rigid plate 152. The at least one groove can reinforce the display device 10. That is, the groove can improve resistance of the back cover 130 to torsion stress which can be applied to the display device 10.

At least one PCB may be mounted at the center of the rigid plate 152. For example, the at least one PCB may be a timing controller board 155. The timing controller board 155 can transfer signals input thereto to the module 100. That is, the timing controller board 155 can transfer timing signals CLK, LOAD and SPi for controlling the source PCB 135 and video signals R, G and B to the source PCB 135. In addition, the timing controller board 155 can control images. The timing controller board 155 may be coupled to the source PCB 135 through a flexible flat cable (FFC). The FFC can include a plurality of signal connecting terminal pins and at least one ground terminal pin for connecting the source PCB 135 and the timing controller board 155. The FFC is cheaper than other cables.

The first and second T-CON covers 157 and 159 may be disposed on the rear side of the rigid plate 152. The first and second T-CON covers 157 and 159 can cover the rigid plate 152 and the timing controller board 155. That is, the first and second T-CON covers 157 and 159 can shield the rigid plate 152 and the timing controller board 155 from the outside.

The first T-CON cover 157 can protect the timing controller board 155 from external impact applied thereto. The first T-CON cover 157 may be made of a metal. Accordingly, the first T-CON cover 157 can block electromagnetic waves emitted from the timing controller board 155. The first T-CON cover 157 may have an opening formed on at least one side thereof such that heat generated from the timing controller board 155 can be emitted to the outside through the opening.

The second T-CON cover 159 may be disposed on the rear side of the first T-CON cover 157. The second T-CON cover 159 may be made of a material identical or similar to the back cover 130. Accordingly, the back cover 130 and the first housing 150 appear to be one body when the user views the display device 10 from the back.

Referring to FIG. 3, the display panel 110 may include a transparent substrate 112, an upper electrode 114, an organic emission layer 116 and a lower electrode 118. The transparent substrate 112, upper electrode 114, organic emission layer 116 and lower electrode 118 may be sequentially formed.

The transparent substrate 112 and the upper electrode 114 may be formed of a transparent material. The lower electrode 118 may be formed of an opaque material. However, the material of the lower electrode 118 is not limited thereto and the lower electrode 118 may be made of a transparent material (e.g. ITO). In this case, light can be emitted from one side of the lower electrode 118.

When a voltage is applied to the upper electrode 114 and the lower electrode 118, light emitted from the organic emission layer 116 can be projected to the outside through the upper electrode 114 and the transparent substrate 112. Here, a light shielding plate may be provided to the rear side of the lower electrode 118 in order to guide light emitted through the lower electrode 118 to the front of the display panel 110.

The display device according to the present invention may be an OLED display. Accordingly, the display device does not require a separate light source and the volume and weight thereof can be reduced. Furthermore, since the OLED display has a response speed 1000 times that of an LCD, afterimages are not generated when the OLED display displays images.

Figure 4:
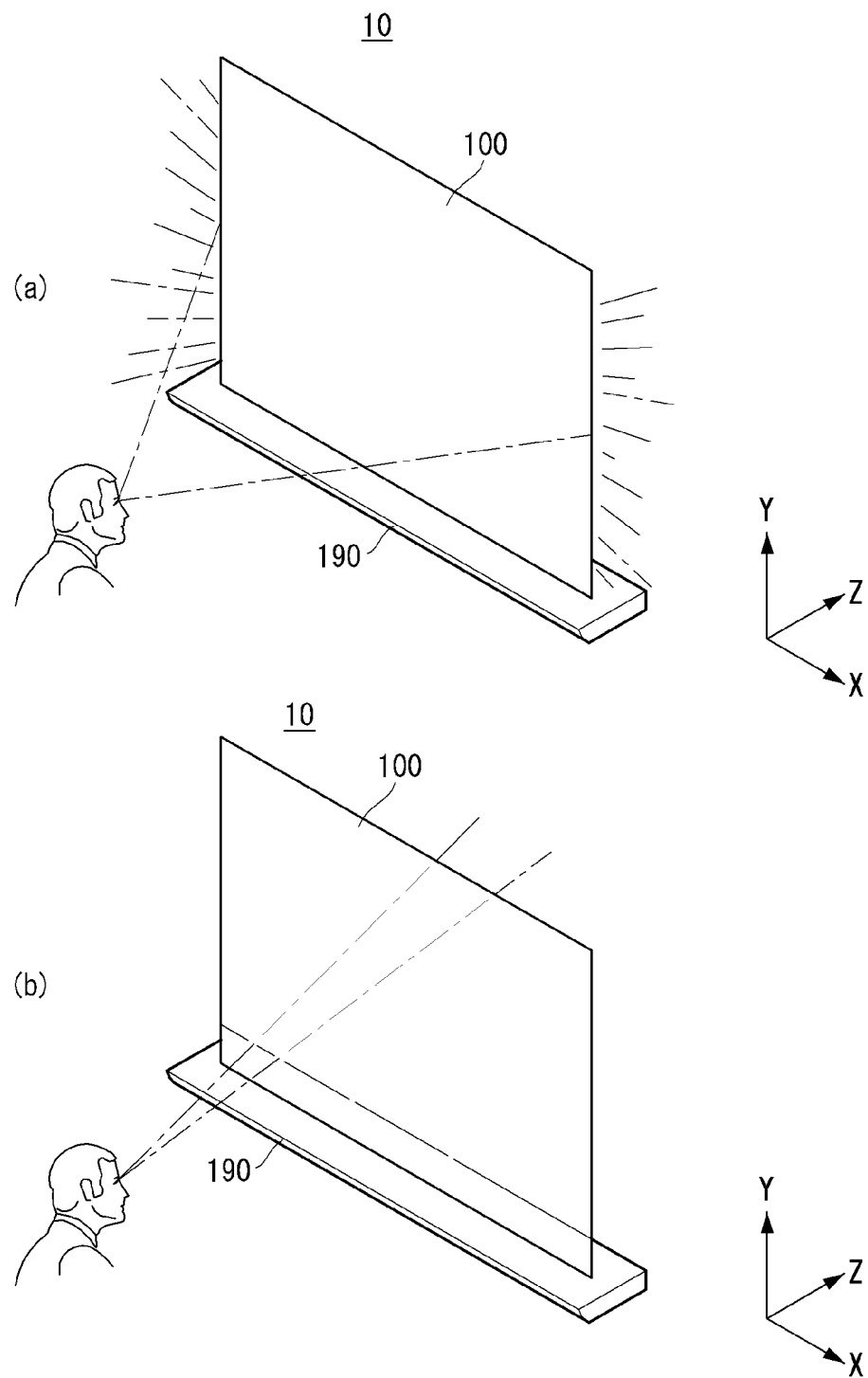

Referring to FIG. 4, the module 100 of the display device 10 according to the present invention may include a transparent material. That is, the back cover may be formed of a transparent material. For example, the back cover can be formed of glass or tempered glass.

The user can view images displayed by the module 100 when the display device 10 is driven. That is, the module 100 can display images through the display panel.

When the display device 10 is turned off, the user can view the background behind the module 100. That is, the user can view the background through the module 100.

The module 100 of the display device 10 according to the present invention may be transparent. Accordingly, the display device 10 has a clean appearance.

Referring to FIG. 5(a), the second housing 190 may include a mounting part MP, a coupling part CP, and a front part FP.

The mounting part MP may be a part in which one or more PCBs are mounted. The mounting part MP may be larger than the coupling part CP and the front part FP. That is, the mounting part MP occupies a wider area than the coupling part CP and the front part FP in the second housing 190. The one or more PCBs may be disposed at intervals. The PCBs may be connected through an electrical wire 231.

The PCBs may have different functions. For example, at least one PCB can be a main board 215. The main board 215 can provide an interface for operating the display device. In addition, the main board 215 can check and manage operating states of components of the display device so as to optimize the operating states. For example, one main board 215 can be mounted in a region at one side of the mounting part MP and another main board 215 can be mounted at the center of the mounting part MP.

Alternatively, at least one PCB may be a power supply 213. The power supply 213 can supply power to the display device. The power supply 213 can convert AC into DC so as to increase electrical efficiency.

The power supply 213 may be separated from the main board 215. For example, the power supply 213 can be disposed opposite the main board 215 located at one side of the mounting part MP in the first direction.

The front part FP may be a part corresponding to the front side of the module when the second housing is coupled to the module. The front part FP may be a part in which one or more speakers 164 are mounted. The speakers 164 may be disposed at both sides of the front part FP. The speakers can output sound to the user. Accordingly, it is efficient to mount the speakers in the front part FP. The speakers 164 may be disposed at intervals such that the user can enjoy stereo sound.

The coupling part CP may be a part between the mounting part MP and the front part FP. The coupling part CP may be a part where the second housing 190 and the first housing are coupled. The coupling part CP can transfer electrical signals of an electronic device mounted in the second housing 190 to the first housing. The coupling part CP may have a connecting bar 174 mounted thereon. The connecting bar 174 may be disposed in a region corresponding to the first housing when the second housing 190 is combined with the display device. Parts for coupling the second housing 190 and the first housing can be installed in the connecting bar 174. The electrical wire 231 may penetrate the connecting bar 174 for electrical signal transfer from the second housing 190 to the first housing. That is, the connecting bar 174 can physically and electrically connect the second housing 190 and the first housing.

The connecting bar 174 may be extended in the first direction. Accordingly, the parts for coupling the second housing 190 and the first housing can be distributed to both housings. In this case, the second housing 190 and the first housing can be firmly coupled by applying less force to the parts.

Referring to FIG. 5(b), only one main board 215 may be mounted in the second housing 190. In this case, the main board 215 is disposed at one side of the second housing 190 and the power supply 213 is disposed opposite the main board 215 in the first direction. In this structure, the side of the second housing 190 is reduced and thus the display device may have a clean appearance.

FIGS. 6 to 27 illustrate the display device according to an embodiment of the present invention.

Figure 6:
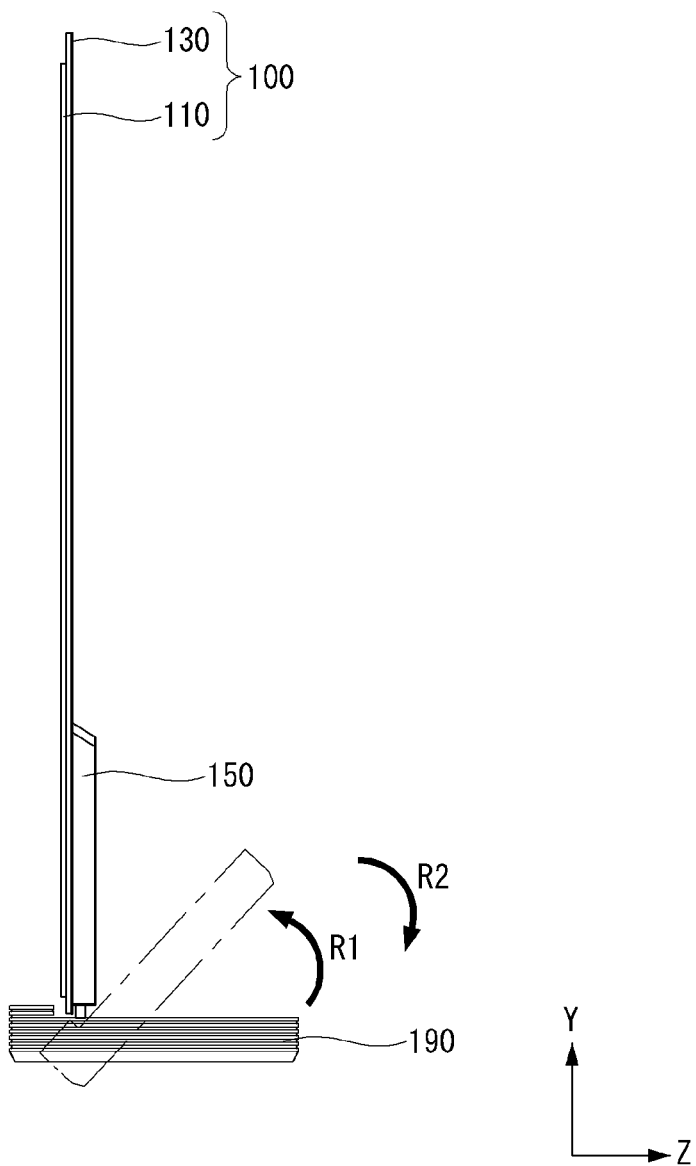

Referring to FIG. 6, in the display device 10 according to the present invention, at least part of the upper surface of the second housing 190 may be coupled to/separated from the rear side of the first housing 150. That is, the display device 10 is in one of a first state in which at least part of the upper surface of the second housing 190 is separated from the rear side of the first housing 150 and a second state in which at least part of the upper surface of the second housing 190 is coupled to the rear side of the first housing 150. The second housing 190 may be extended in a direction perpendicular to the first housing 180 in the first state and extended in parallel with the first housing 150 in the second state.

The second housing 190 may rotate in a first rotating direction R1 to be combined with the rear side of the first housing 150. In addition, the second housing 190 may rotate in a second direction R2 to be separated from the rear side of the first housing 150. For example, the first direction R1 is counterclockwise and the second direction R2 is clockwise.

The second housing 190 can support the module 100 and the first housing 150 in the first state. That is, the user can locate the second housing 190 in a desired place and view the display screen in the first state. The second housing 190 can stably support the module 100 and the first housing 150 since the lower surface of the second housing 190 has a wide area in the first state.

The second housing 190 can be attached to a surface to which the display device is attached in the second state. The upper surface of the second housing 190 can be combined with the first housing 150 and the lower surface thereof can be attached to the attached surface in the second state. The second housing 190 can be stably attached to the attached surface since the lower surface of the second housing 190 has a wide area. The user can set the display device 10 or hang the display device 10 on the wall without using a tool. A description will be given of a process of switching the second housing 190 from the first state to the second state and display device structures in the first and second states.

Referring to FIG. 7, a wall-mounting assembly 170 may be provided to the lower surface of the second housing 190 so as to easily attach the display device 10 to the attached surface in the second state. The wall-mounting assembly 170 may be provided to the center of the second housing 190.

The width BW of the wall-mounting assembly 170 in the second direction may be greater than the width HW of the second housing 190. Accordingly, both the upper side and the lower side of the wall-mounting assembly 170 may be not coupled to the second housing 190. When at least one of the upper side and the lower side of the wall-mounting assembly 170 is coupled to the back cover 130, the back cover 130 needs a hole for coupling and thus the back cover 130 may be cracked.

Accordingly, to firmly couple the wall-mounting assembly 170 and the display device 10, a locking bracket 163 may be provided to the first housing 150. The locking bracket 163 protrudes upward from the inside of the first housing 150. The lower side of the wall-mounting assembly 170 may be coupled to the second housing 190 through at least one screw. The upper side of the wall-mounting assembly 170 may be coupled to the locking bracket 163 through at least one screw. The locking bracket 163 is located inside of the first housing 150 in the first state and protrudes from the first housing 150 in the second state. The structure and operating method of the locking bracket 163 will be described in detail later. The wall-mounting assembly 170 can be attached to the attached surface more stably since the wall-mounting assembly 170 has wider area than the second housing 190.

Figure 8:
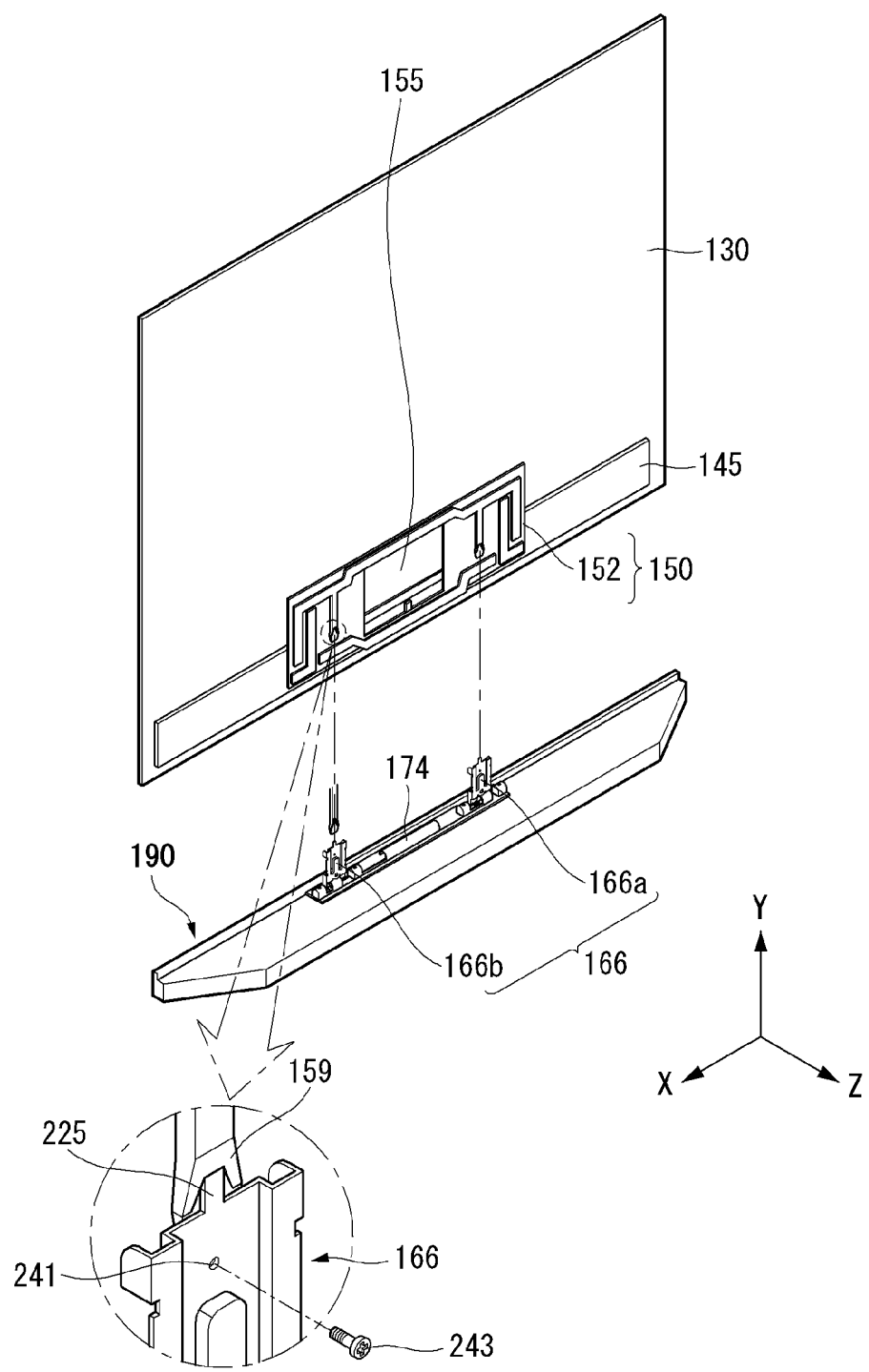

Referring to FIG. 8, the second housing 190 and the first housing 150 may be coupled through hinges 166. The hinges 166 may include a first hinge 166a and a second hinge 166b disposed at both ends of the connecting bar 174. Since the hinges 166 are provided to both ends of the connecting bar 174, force applied to the hinges 166 can be dispersed. Accordingly, the first housing 150 and the second housing 190 can be firmly coupled so as not to be easily separated from each other.

The hinge 166 may include a protruding part 225 opposite the side coupled to the connecting bar 174. The protruding part 225 can be inserted into a groove 159 formed in the rigid plate 152. The groove 159 can be formed in a shape protruding to the rear side of the rigid plate 152 so as to form a space into which the protruding part 225 is inserted. The groove 159 can guide a position at which the protruding part 225 is coupled to the rigid plate 152.

The hinge 166 may have a convexo-concave part formed in at least part thereof. The convexo-concave part of the hinge 166 can improve the rigidity of the hinge 166. This can increase the resistance of the hinge 166 to torsion stress that can be applied to the display device 10 during switching from the first state to the second state.

A concave part of the convexo-concave part formed in the hinge 166 may include at least one hole 241 for coupling the hinge 166 and the rigid plate 152. Since the at least one hole 241 is formed in the concave part of the hinge 166, the rigid plate 152 and the hinge 166 can be coupled more firmly. The rigid plate 152 and the hinge 166 can be coupled through the least one hole 241 using at least one screw 243.

In the display device 10 according to the present invention, the protruding part 225 of the hinge 166 is inserted into the groove 159 of the rigid plate 152 and thus the hinge 166 and the rigid plate 152 can be coupled to each other. Accordingly, the coupling position of the hinge 166 is guided to enable the first housing 150 and the second housing 190 to be coupled at a correct position.

Figure 9:
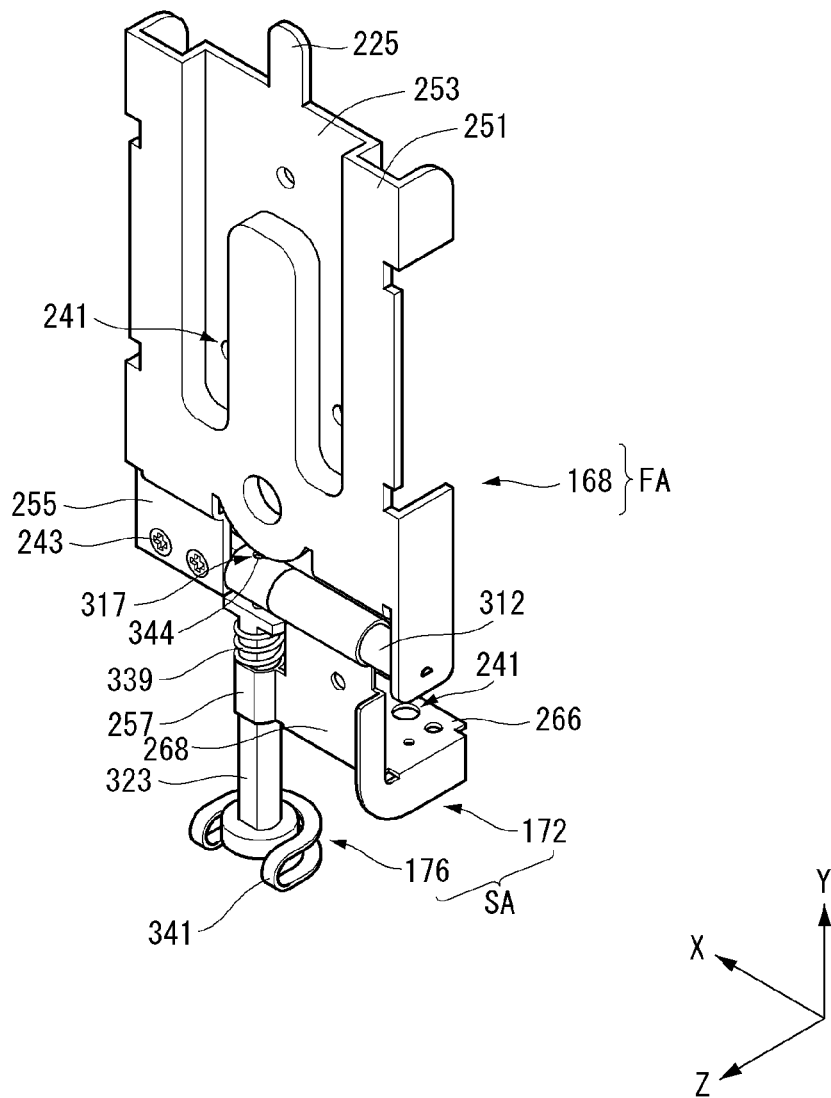

Referring to FIG. 9, the hinge 166 may include a first area FA and a second area SA. The first area FA includes a body part 168 and the second area SA includes a fixing part 172 and an adjustment part 174. The second area SA rotates on the basis of the first area FA and can change the state of the second housing. In the first state, the first area FA and the second area SA are extended in the same direction. While FIG. 9 shows the first hinge 166a, the second hinge 166b can have a shape identical or similar to the first hinge 166a.

The first area FA may be a part coupled to the first housing and the second area SA may be a part coupled to the second housing.

The body part 168 may include the protruding part 225, the concave part 253, a convex part 251, a support plate 255 and a hinge bar 312.

The concave part 253 may be a recessed portion compared to other portions of the body part 168. Accordingly, when the concave part 253 of the hinge 166 is coupled to another part of the display device, a distance for coupling can be short. That is, the concave part 253 can be strongly coupled to another part. The concave part 253 can be coupled to another part through the at least one hole 141. The at least one hole 241 may be symmetrical with at least one other hole 241 on the basis of the body part 168. Accordingly, when the hinge 166 is coupled to another part, force can be dispersed.

The convex part 251 may be a protruding part compared to other portions of the hinge. That is, the convex part 251 can protrude in a direction opposite the direction in which the concave part 253 is recessed. The convexo-concave part formed according to the concave part 253 and the convex part 251 can improve rigidity of the hinge 166.

The support plate 255 can couple the fixing part 172 and the adjustment part 176 to the body part 168. The support plate 255 can protrude in a direction opposite the side of the hinge 166 at which the protruding part 225 is formed. The support plate 255 can be coupled to the hinge bar 312 to which the fixing part 172 and the adjustment part 176 are coupled through the at least one screw 243.

One end of the hinge bar 312 may be coupled to the support plate 255 and the other end thereof may be directly coupled to the side of the body part 168. The hinge bar 312 may have a cylindrical form which connects both sides of the body part 168. The hinge bar 312 can serve as a shaft for changing the fixing part 172 and the adjustment part 176 from the first state to the second state.

The fixing part 172 can be coupled to the hinge bar 312 while covering the hinge bar 312. That is, the fixing part 172 can be coupled to the hinge bar 312 with one side thereof covering the cylindrical shape of the hinge bar 312. The fixing part 172 may include a connecting portion 268, a housing coupling portion 266 and an adjustment coupling portion 257.

The connecting portion 268 may be the body of the fixing part 172. The connecting portion 268 can be coupled to other components of the fixing part 172.

The housing coupling portion 266 can be extended in a direction perpendicular to the connecting portion 268. The housing coupling portion 266 can couple the hinge 166 and the second housing. The hinge 166 can be coupled to the second housing through the at least one hole 241. The housing coupling portion 266 can be extended in the direction of the inside of the second housing so as to be firmly coupled to the second housing. The second housing may need to be supported only with coupling force of the housing coupling portion 266 and the second housing in the second state. Accordingly, the housing coupling portion 266 may be made of a material with high rigidity.

The adjustment coupling portion 257 may have a shape covering the adjustment part 176. The adjustment coupling portion 257 may have a shape surrounding a cylindrical post 323. Accordingly, the adjustment coupling portion 257 can have a diameter greater than that of the post 323 of the adjustment part 176. Due to the diameter difference, a spring 339 can be stopped by the adjustment coupling portion 257. The adjustment coupling portion 257 can fix the adjustment part 176 to the hinge bar 312 using elasticity of the spring 339.

The adjustment part 176 can fix the hinge 166 in the first state or second state using elasticity of the spring 339. That is, the adjustment part 176 can be extended in the same direction as the body part 168 in the first state and extended in a direction perpendicular to the body part 168 in the second state.

The adjustment part 176 may include the spring 339, the post 323, an inserted part 344 and a thumbscrew 341.

The spring 339 can be inserted into the post 323. Specifically, the spring 339 can be disposed between the adjustment coupling portion 257 and the end of the post 323. The spring 339 can expand according to elasticity so as to be released in the first state. In this case, the inserted part 344 can be inserted into an insertion hole 317 of the hinge bar 312 according to elasticity of the spring 339. Accordingly, the hinge 166 can be fixed without being moved by external force.

The inserted part 344 may protrude from one end of the adjustment part 176. The inserted part 344 can be inserted into the insertion hole 317 of the hinge bar 312 in the first state and separated from the insertion hole 317 upon change to the second state from the first state.

The thumbscrew 341 may be disposed at the other end of the adjustment part 176. The thumbscrew 341 may have a ring shape so as to be easily held and adjusted by the user. The thumbscrew 341 may be normally disposed horizontally such that the ring shape does not protrude. When the user adjusts the thumbscrew 341, the thumbscrew 341 may be vertically disposed such that the user can easily pull the thumbscrew 341. The user can apply external force to the adjustment part 176 using the thumbscrew 341.

Figure 10:
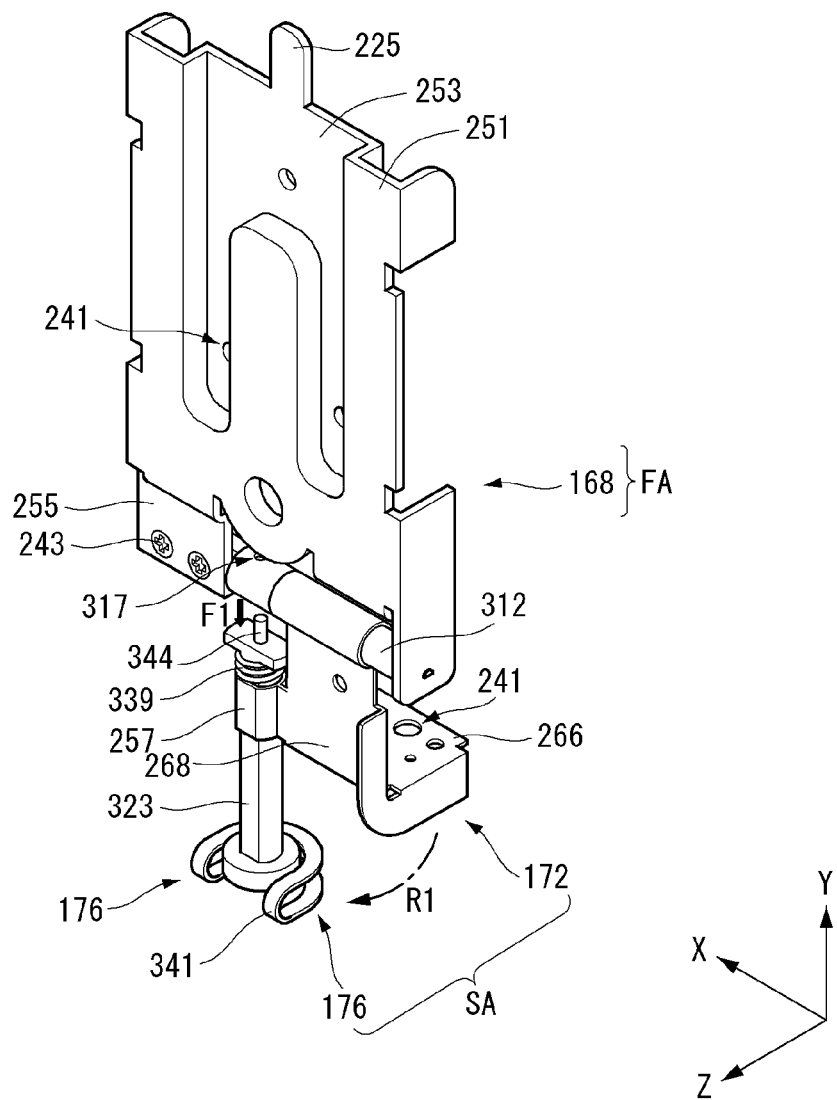

Referring to FIG. 10, the inserted part 344 may be separated from the insertion hole 317 for switching from the first state to the second state. The user can pull the thumbscrew 341 such that the spring 339 contracts. That is, the user can apply external force F1 to the post 323 such that the spring 339 contracts. The external force F1 may be identical or greater than the elasticity of the spring 339. As the spring 339 contracts, the inserted part 344 can be pulled with the post 323.

Upon separation of the inserted part 344 from the insertion hole 317, the fixing part 172 can be rotated. The user can rotate the fixing part 172 such that the second housing coupled to the fixing part 172 changes to the second state. The user can rotate the fixing part 172 while pulling the thumbscrew 341 such that the elasticity of the spring 339 does not disturb rotation of the fixing part 172. However, the present invention is not limited thereto and the user may rotate the fixing part 172 without pulling the thumbscrew 341 in a region that does not correspond to the insertion hole 317.

During switching from the first state to the second state, the second area SA can rotate in a first rotation direction R1 with respect to the first area FA. That is, the second area SA can rotate toward the rear side of the first area FA.

Since the second housing 190 coupled to the fixing part 172 rotates with the fixing part 172 when the fixing part 172 rotates, a large force may be needed for rotation. Accordingly, it is desirable to rotate the fixing part 172 while pulling the thumbscrew 341 since there is no frictional force generated between the hinge bar 312 and the inserted part 344.

Figure 11:
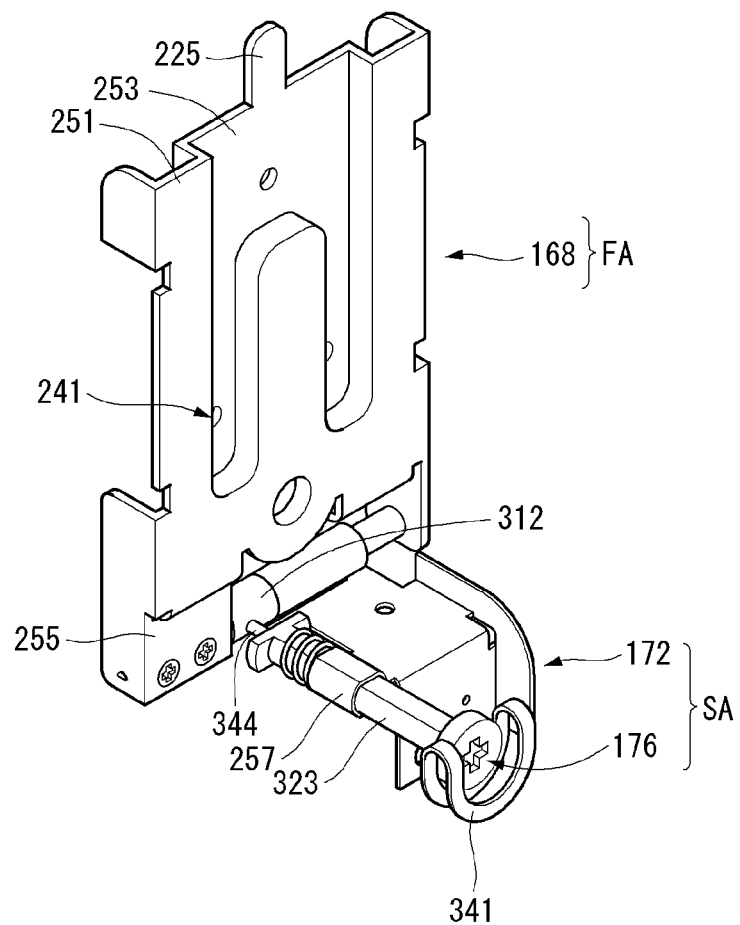

Referring to FIG. 11, the first area FA and the second area SA may be respectively extended in directions perpendicular to each other in the second state. That is, the body part can be at right angles to the adjustment part 176 and the fixing part 172 in the second state. The inserted part 344 may not correspond to the insertion hole of the hinge bar 312 in the second state. Accordingly, the inserted part 344 may be in contact with the outside of the hinge bar 312 instead of being inserted into the hinge bar 312. The inserted part 344 may be pushed out toward the hinge bar 312 due to the elasticity of the spring 339.

The fixing part 172 can support the second housing in the second state. Accordingly, the adjustment part 176 can be fixed to the hinge bar 312 in the second state. Otherwise, the second housing may be returned to the first state from the second state since the second housing is not firmly supported. A method of fixing the adjustment part 176 to the hinge bar 312 in the second state will be described later.

Figure 12:
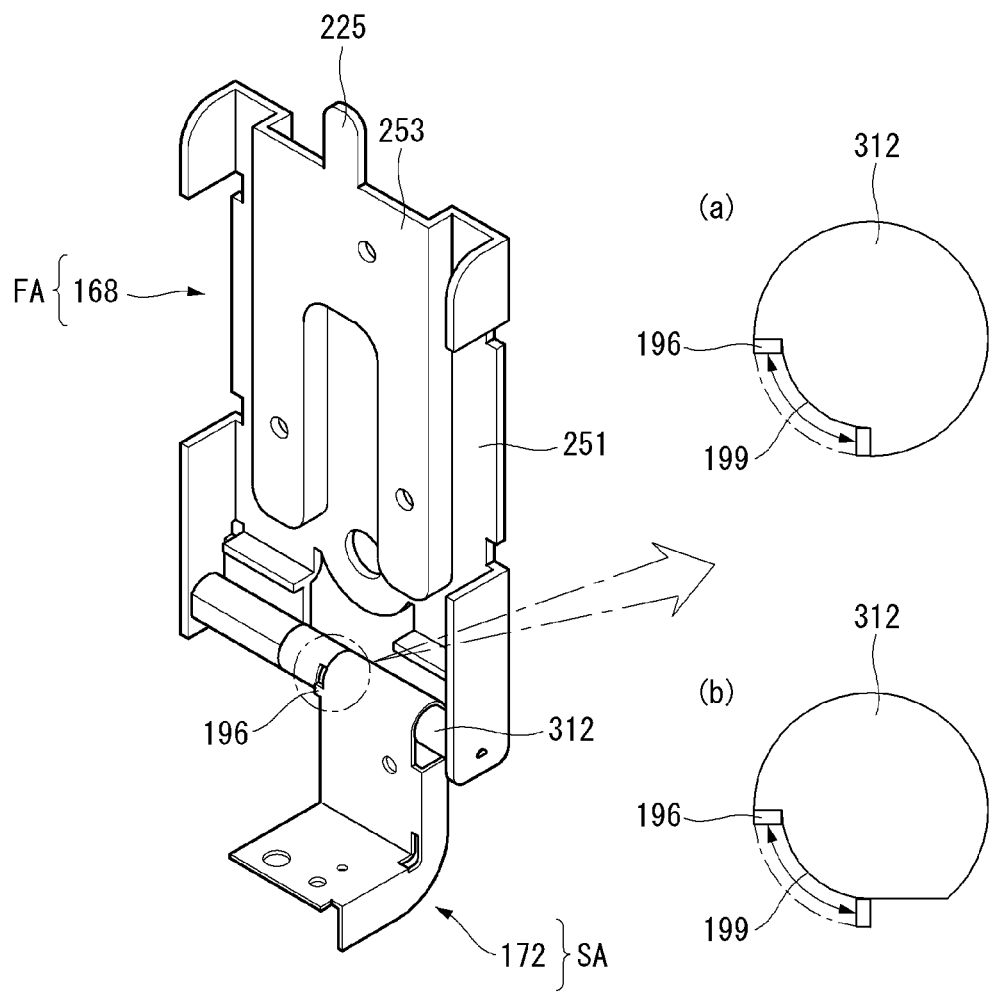

Referring to FIG. 12, a rail part 196 protruding from the side of the fixing part 172 may be inserted into a guide groove 199 such that the fixing part 172 can move between the first state and the second state. The portion of the hinge bar 312, which corresponds to the guide groove 199, may have a smaller diameter than other portions. The rail part 196 can be restricted by the hinge bar 312 when passing over the guide groove 199. Accordingly, there is a low possibility that the second housing unexpectedly moves and thus be cracked or damaged when changing to the first state or the second state.

As shown in FIG. 12(*a*), the rail part 196 may be located between a state in which the rail part 196 faces the front side of the hinge bar 312, which corresponds to the first state, and a state in which the rail part 196 faces down, which corresponds to the second state. To this end, the guide groove 199 may be positioned in the range of 0 to 90 degrees counterclockwise on the basis of the direction of the front side of the hinge bar 312. In this case, the fixing part 172 may be fixed to 0 degrees counterclockwise when the rail part 196 is in the first state. The fixing part 172 may be fixed to 90 degrees counterclockwise when the rail part 196 is in the second state.

Referring to FIG. 12(*b*), the guide groove 199 may be positioned in the range of 0 to 90 degrees counterclockwise on the basis of the direction of the front side of the hinge bar 312. In addition, the guide groove 199 may be further formed in a straight line toward the rear side of the hinge bar 312 from the portion at an angle of 90 degrees counterclockwise. In this case, the rail part 196 may not rotate by 90 degrees or more by being restricted by the hinge bar 312 in the second state.

The guide groove 199 according to the present embodiment may not directly block the rail part 196 in the second state, compared to the guide groove 199 shown in FIG. 12(*a*). Accordingly, the manufacturing process can be simplified and manufacturing costs can be reduced.

Figure 13:
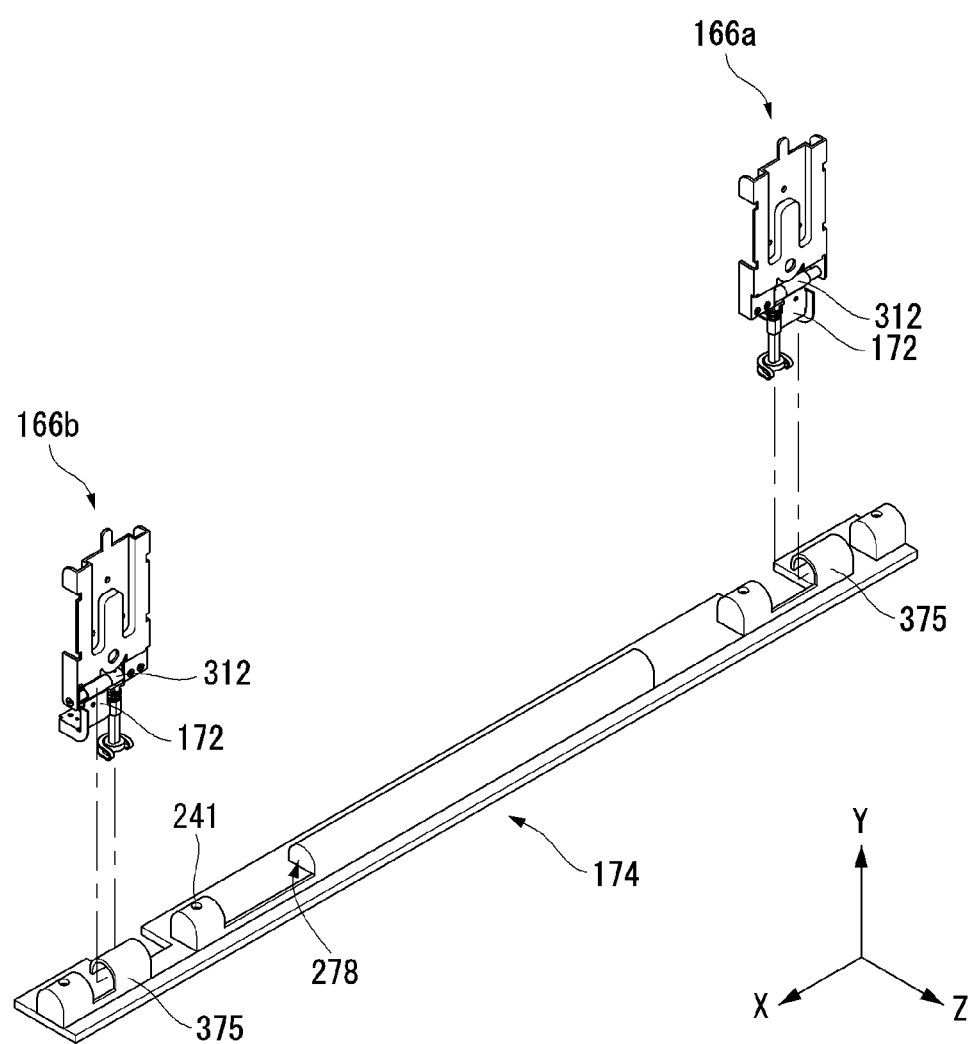

Referring to FIG. 13, the first and second hinges 166*a* and 166*b* may be coupled to the connecting bar 174. The hinge bar 312 may be inserted into and combined with openings 375 formed at both ends of the connecting bar 174. The hinge bar 312 can be coupled to the second housing through the fixing part 172 after insertion into the connecting bar 174.

The connecting bar 174 may include the openings 375, at least one hole 241 and a through-hole 278. The center of the connecting bar 174 protrudes such that the hinges 166 or electrical wires can be easily inserted therein.

The through-hole 278 may be disposed at the center of the connecting bar 174. The through-hole 278 can laterally penetrate the protruding portion of the connecting part 174. The through-hole 278 may be a passage through which electrical wires are inserted to electrically connect the first housing and the second housing.

The at least one hole 241 may be formed in a protruding portion of the connecting bar 174. The at least one hole 241 can vertically penetrate the connecting bar 174. The at least one hole 241 can be used to couple the connecting bar 174 to the inside of the second housing.

Figure 14:
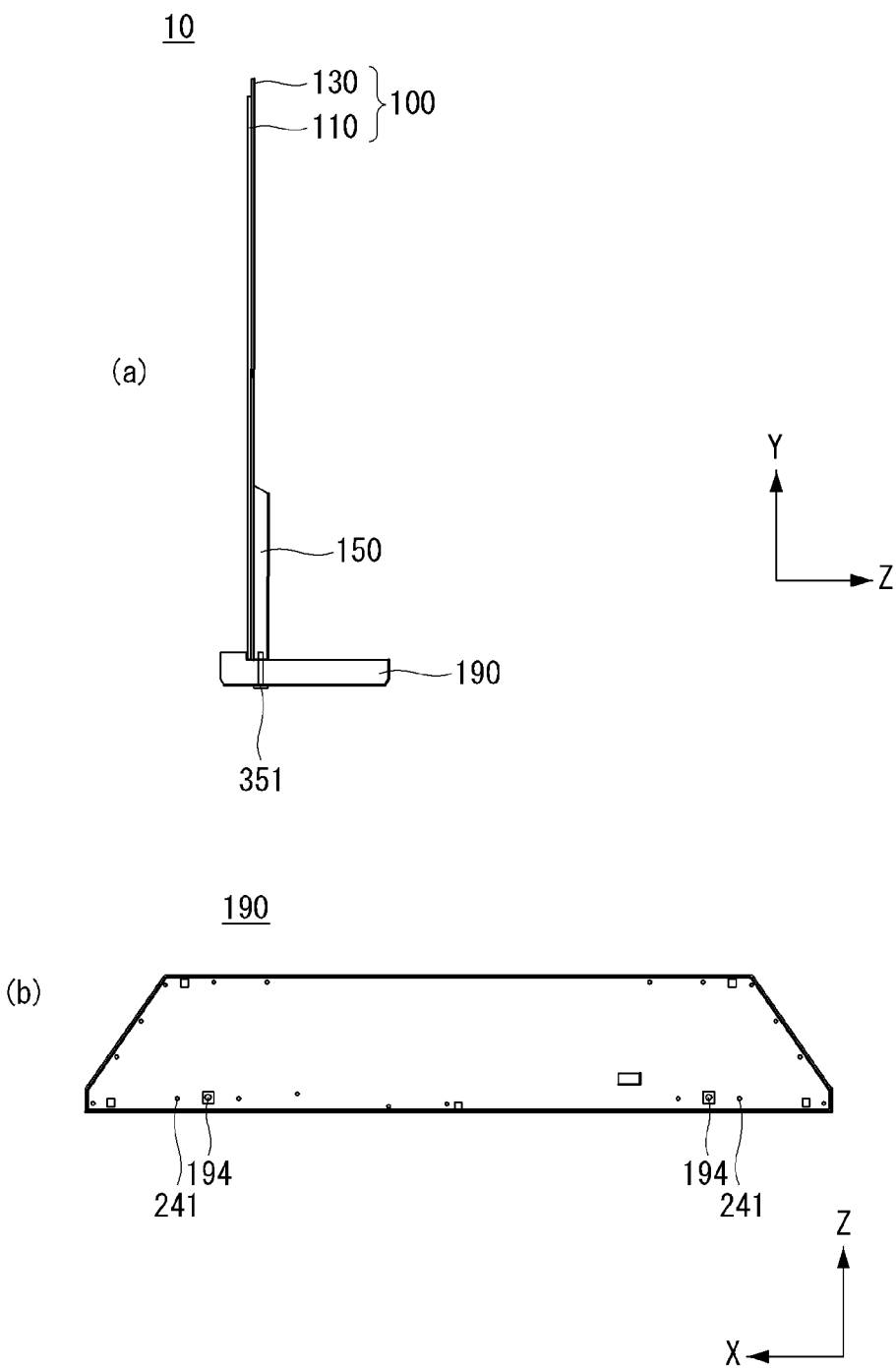

Referring to FIG. 14, in the display device 10 according to the present invention, a through bolt 351 may penetrate the second housing 190 to be coupled to the first housing 150 in the first state. The through bolt 351 may be coupled to the lower surface of the first housing 150 through the at least one hole 241 penetrating the second housing 190 in the first state.

The at least one hole 241 may be formed at both sides of a hinge hole 194 into which the thumbscrew of the hinge is inserted. Since the hinge hole 194 is disposed at both sides of the second housing 190, a total of four holes 241 can be disposed at both sides of the second housing 190. In this case, the through bolt 351 couples the first housing 150 and the second housing 190 at both sides of the first housing 150 and the second housing 190 and thus force can be easily dispersed. Accordingly, the through bolt 351 can be easily coupled to the first housing 150 and the second housing.

Figure 15:
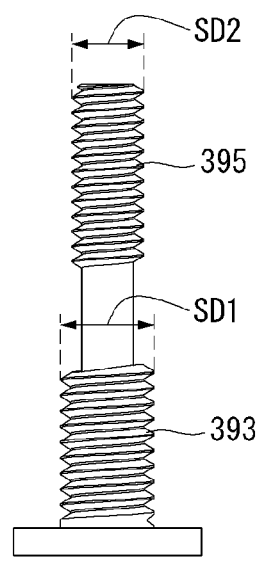

Referring to FIG. 15, the through bolt 351 may include a first screw region 393 and a second screw region 395. The first screw region 393 may have a first diameter SD1 and the second screw region 395 may have a second diameter SD2. The first diameter SD1 may be greater than the second diameter SD2.

At least one hole of the second housing may engage with the first screw region 393 having the first diameter SD1 and at least one hole of the first housing may engage with the second screw region 395 having the second diameter SD2. Since the second diameter SD2 of the second screw region 395 is smaller than the first diameter SD1 of the first screw region 393 engaging with the at least one hole of the second housing, the through bolt 351 can easily penetrate the holes. Accordingly, the through bolt 351 can be coupled to the second housing by fastening only the first screw region 393. The second screw region 395 easily penetrating the second housing can be coupled to the first housing. Accordingly, the through bolt 351 can be rapidly coupled to the first housing 150 and the second housing 190 during change from the first state to the second state, compared to a through bolt having a uniform diameter.

Figure 16:
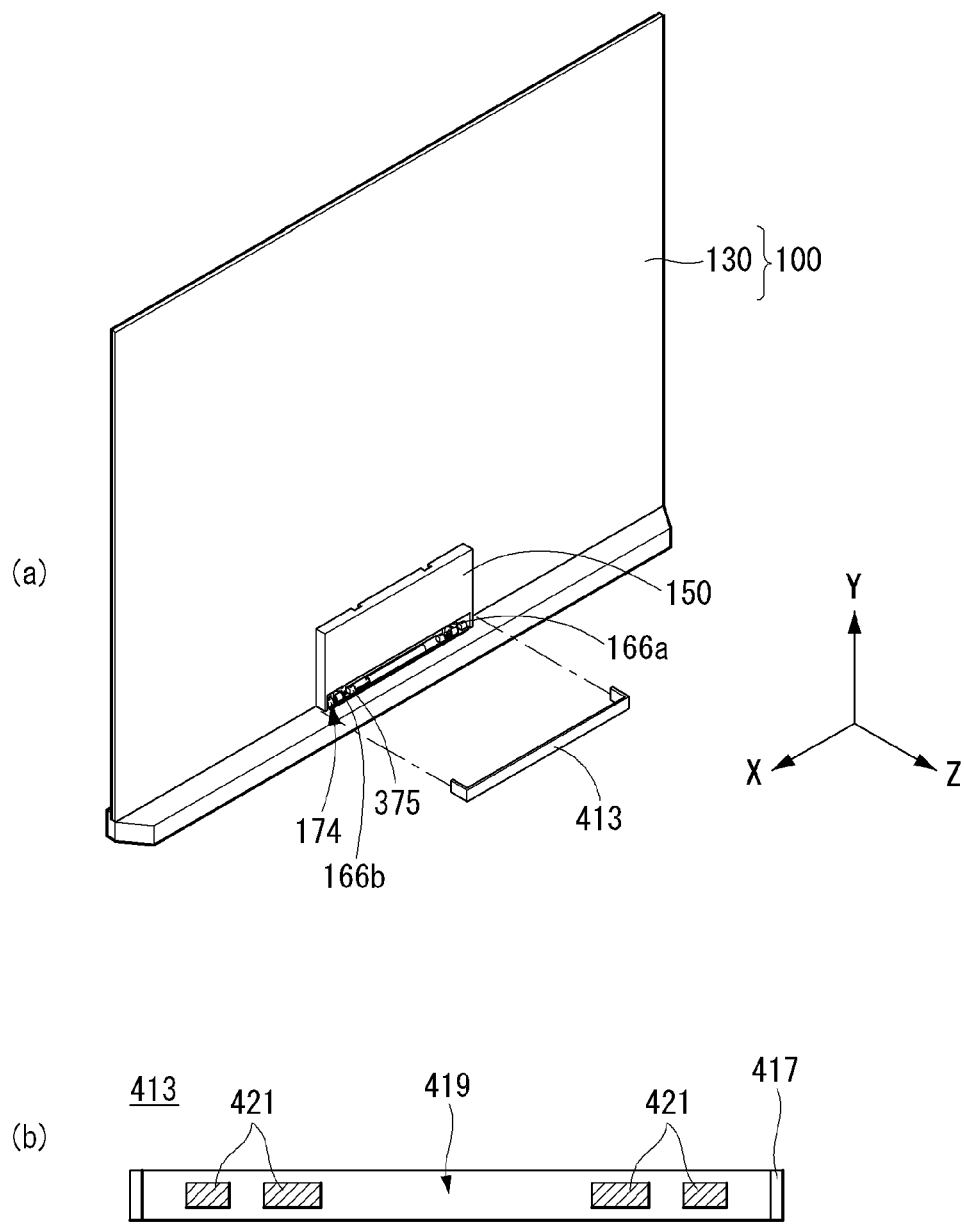

Referring to FIG. 16, the display device 10 according to the present invention may further include a hinge cover 413 for shielding the hinges 166 exposed through the connecting bar 174.

When the first housing 150 and the second housing 190 are coupled, the hinges 166 may be exposed through the connecting bar 174. In this case, since the hinges 166 are made of a material different from the connecting bar 174 (e.g. the hinges 166 are formed of a metal and the connecting bar 174 is made of plastic), the display device may have an untidy appearance.

Accordingly, the hinge cover 413 may be provided to cover the side of the connecting bar 174. As shown in FIG. 16(b), the hinge cover 413 may include adhesive members 421 corresponding to the exposed hinges 166. The adhesive members 421 may be made of a magnetic material. Since the hinges 166 are formed of a metal, the hinges 166 can be firmly coupled to the adhesive members 421.

The display device 10 according to the present invention has the hinge cover 413 attached to the connecting bar 174. Accordingly, the display device can have a neat appearance.

Figure 17:
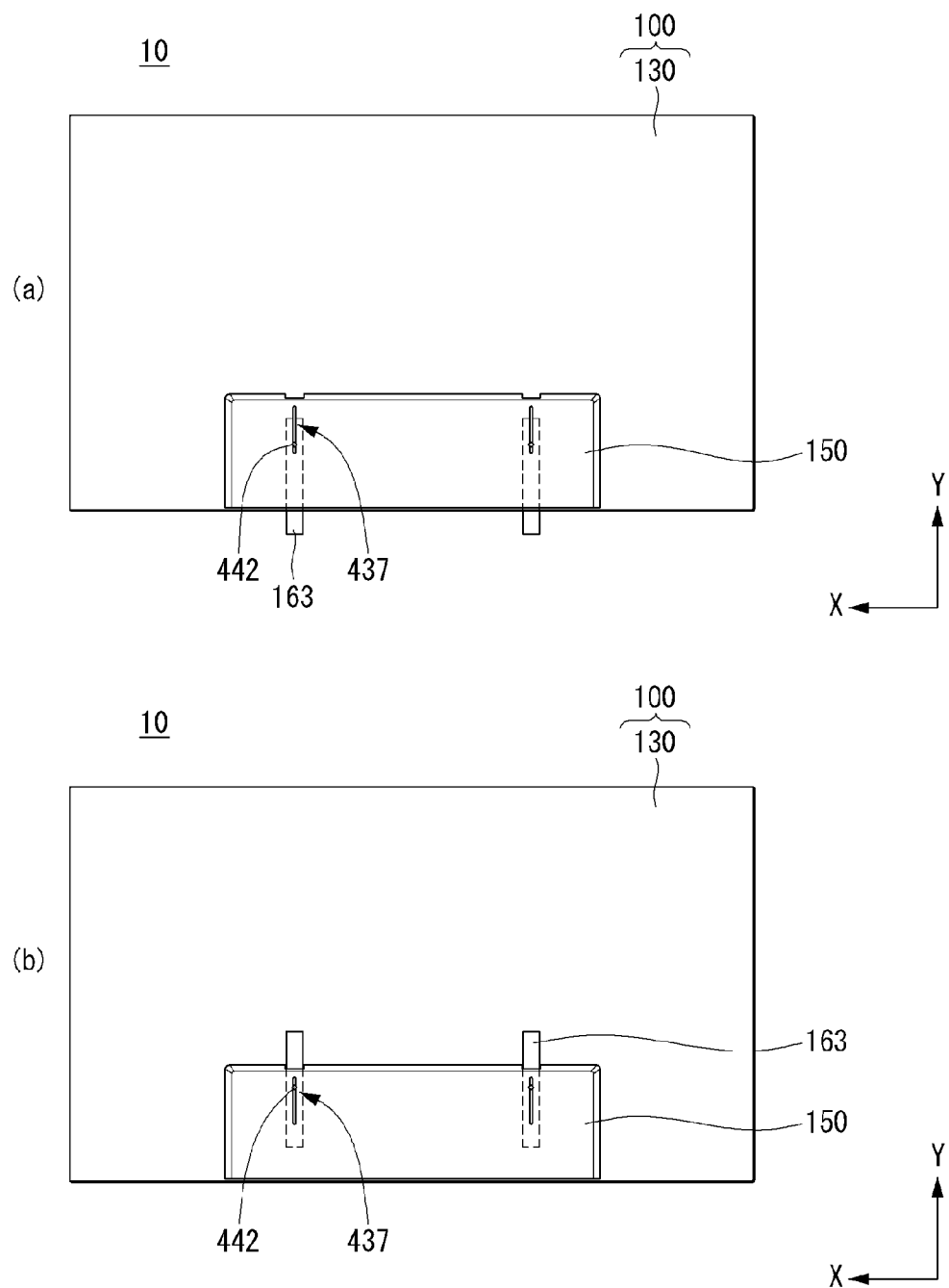

Referring to FIG. 17, in the display device 10 according to the present invention, the locking bracket 163 may be disposed at different positions in the first state and the second state. As shown in FIG. 17(a), the locking bracket 163 may protrude from the lower end of the first housing 150 in the first state. The user can move the locking bracket 163 down by adjusting a handle 442 provided to the center of the locking bracket 163.

Referring to FIG. 17(b), the locking bracket 163 can protrude from the upper end of the first housing 150 in the second state. The user can move the locking bracket 163 up by adjusting the handle 442 provided to the center of the locking bracket 163.

The handle 442 can be exposed through a guide bracket 437 of the first housing 150. The handle 442 can protrude to the rear side of the display device 10 from the locking bracket 163.

The guide bracket 437 can guide positions to which the locking bracket 163 moves. The width of the guide bracket 437 in the first direction may be less than the diameter of the handle 442. Accordingly, the handle 442 may not be inserted into the guide bracket 437.

Figure 18:
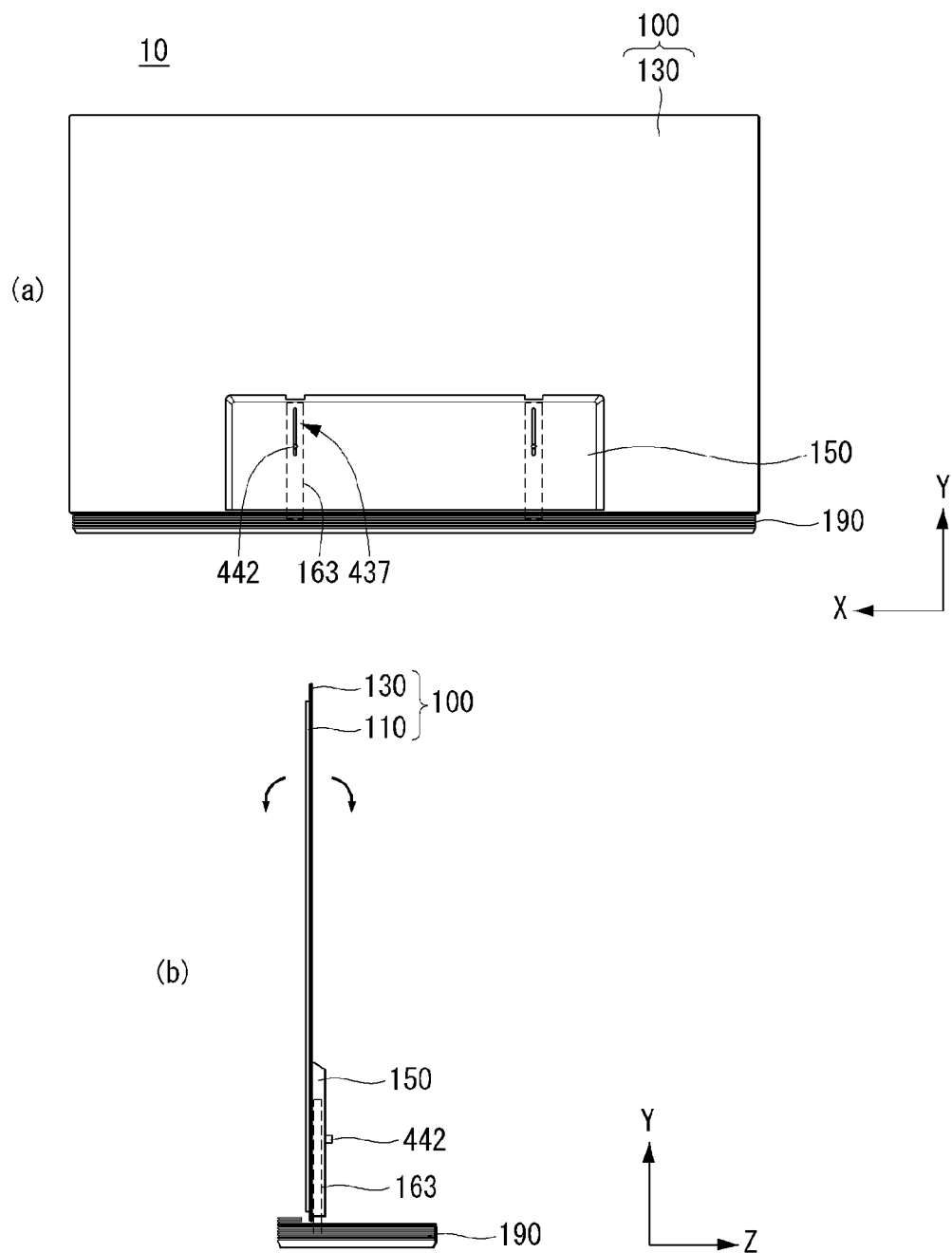

Referring to FIG. 18, the locking bracket 163 protruding from the first housing 150 may be coupled to the second housing 190 in the first state.

The protruding portion of the locking bracket 163 may be inserted into a groove formed in the second housing 190. The groove may engage with the protruding portion of the locking bracket 163. A method of coupling the locking bracket 163 and the second housing 190 will be described later. Accordingly, the module 100 can be fixed without shaking back and forth and thus the user is not distracted from the display screen.

Figure 19:
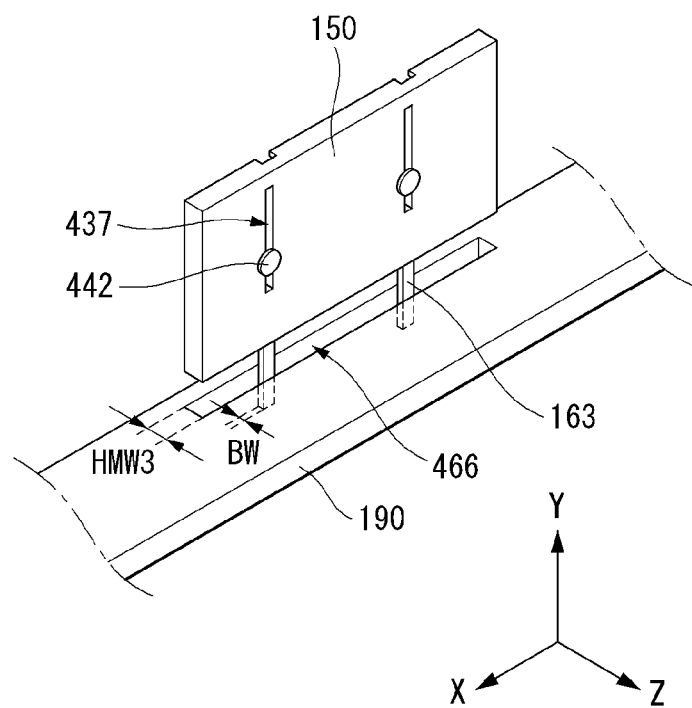

Referring to FIG. 19, the protruding portion of the locking bracket 163 may be inserted into a groove 466 formed in the second housing 190. The width HMW3 of the groove 466 in the third direction may be identical or similar to the thickness BW of the locking bracket 163. Accordingly, the locking bracket 163 can be fixed to the groove 466 without shaking back and forth.

In addition, the protruding portion of the locking bracket 163 may be shorter than the thickness of the second housing 190. Accordingly, the protruding portion of the locking bracket 163 may not exceed the thickness of the second housing 190 even when the handle 442 is moved to the lower end of the guide bracket 437.

Figure 20:
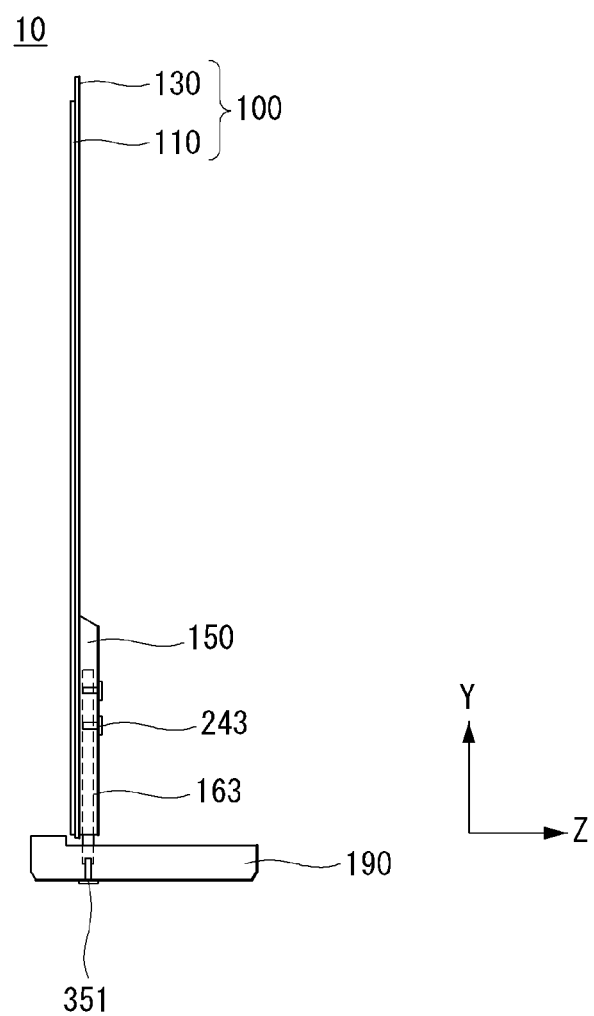
Figure 22:
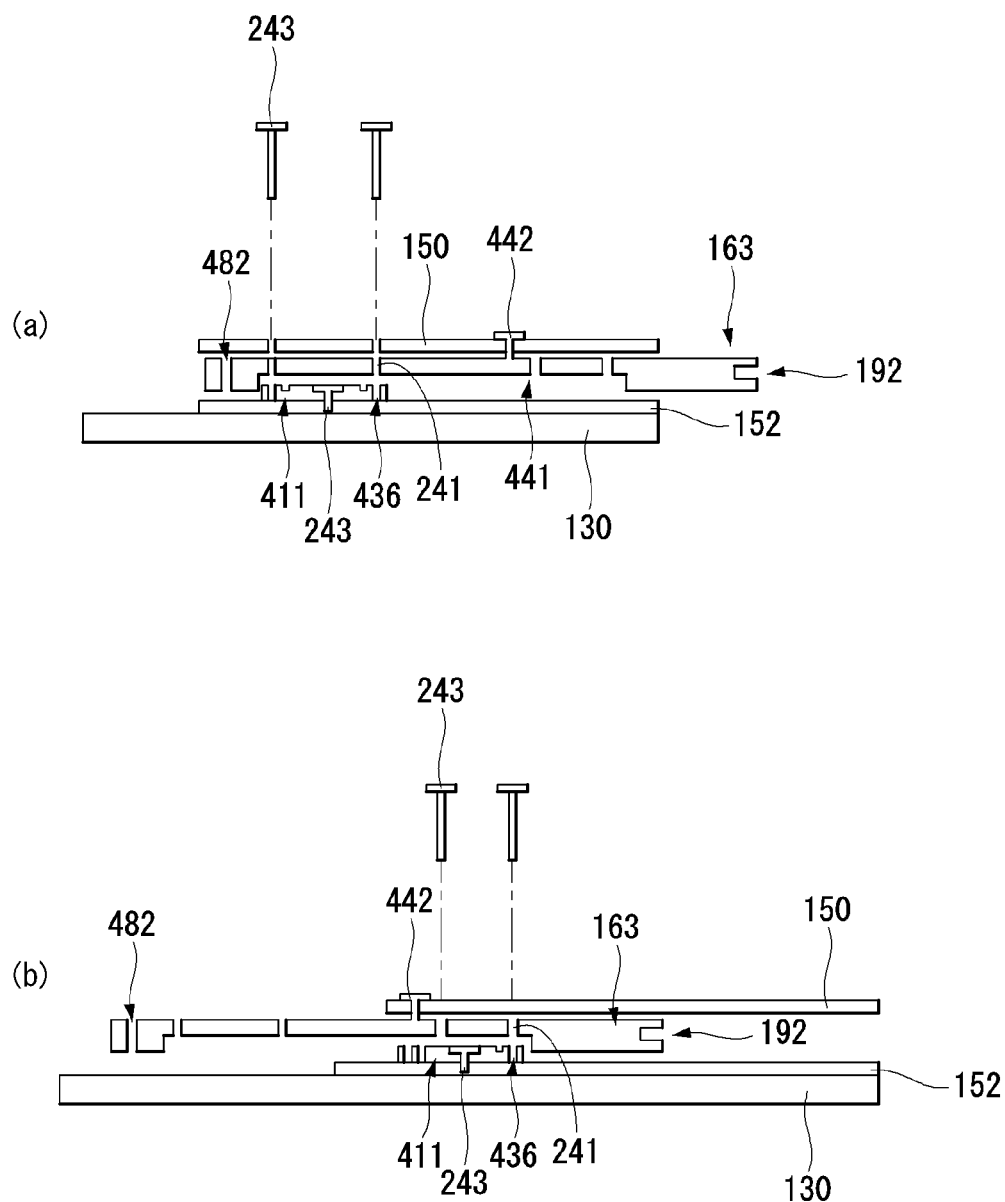

Referring to FIG. 20, the locking bracket 163 may be coupled to the first housing 150 through the rear side of the first housing 150 using at last one screw 243. In this case, the at least one screw 243 can be coupled to the rigid plate of the first housing 150 by penetrating the locking bracket 163. However, the present invention is not limited thereto and the at least one screw 243 may penetrate the locking bracket 163 so as to be coupled to the back cover 130.

The second housing 190 may be coupled to the lower surface of the locking bracket 163 through the through bolt 351. The detailed structure of the locking bracket 163 will be described later.

The locking bracket 163 can be coupled to the first housing and the second housing through the rear side and the lower surface thereof such that the locking bracket 163 does not move in the first state. Accordingly, the module 100 does not move and thus the user is not distracted from the display screen.

Referring to FIG. 21, the locking bracket 163 may include a stopper 441 and a wall-mounting hole 482 formed on the front side thereof and a second housing coupling hole 192 formed at the lower surface thereof.

The stopper 441 may be recessed to the inside of the locking bracket 163. The stopper 441 can guide a movement end point when the locking bracket 163 is moved up and down. The stopper 441 may include at least one hole 241. The at least one hole 241 can fix the locking bracket 163 through a screw in the first state or second state. A sliding member 411 which will be described below may be inserted into the stopper 441. The thickness HMT of the stopper 441 may be less than the thickness HIT of the locking bracket 163. Accordingly, the stopper 441 may not penetrate the locking bracket 163.

The wall-mounting hole 482 may be a part combined with the wall-mounting assembly in the second state. As shown in FIG. 7, the upper part of the wall-mounting assembly and the wall-mounting hole can be coupled using a screw in the second state. The wall-mounting hole 482 may have a diameter greater than other holes.

The second housing coupling hole 192 can couple the locking bracket 163 and the second housing using a through bolt. The second housing coupling hole 192 may have a diameter greater than other holes.

The sliding member 411 may be disposed in the stopper 441 of the locking bracket 163. The sliding member 411 can guide a position to which the locking bracket 411 is moved. The sliding member 411 may be made of a material having low coefficient of friction such that the locking bracket 163 can easily move. For example, the sliding member can be made of POM. The sliding member 411 may include locking parts provided to the upper and lower sides thereof and a plate coupling part 452 provided to the center thereof.

The locking parts 436 may be coupled to the first housing together with the locking bracket 163 in the first state or second state. Accordingly, the distance HD between holes 241 of the stopper 441 can correspond to the distance SPD between the locking parts 436. The locking parts 436 may have a protruding shape such that the locking parts 436 can be easily coupled even using a short screw.

The plate coupling part 452 can fix the sliding member 411. Specifically, the plate coupling part 452 can fix the sliding member 411 to the rigid plate 152 using a screw. The plate coupling part 452 may be surrounded by a sidewall 474 such that the screw does not come into contact with the stopper 441.

Referring to FIG. 22(a), at least one hole 241 formed in the upper part of the stopper 441 and the locking part 436 may be combined with each other through the screw 243 in the first state. In this case, the lower part of the locking bracket 163 can be exposed to the outside of the housing 150.

Referring to FIG. 22(b), at least one hole 241 formed in the lower part of the stopper 441 and the locking part 436 may be combined with each other through the screw 243 in the second state. In this case, the upper part of the locking bracket 163 can be exposed to the outside of the housing 150.

The sliding member 411 positioned inside the locking bracket 163 may not move during change from the first state to the second state. When the stopper 441 contacts the upper side or the lower side of the sliding member 411, the user can easily recognize whether the display device is in the first state or second state. Since the locking part 436 and the at least one hole 241 overlap in the first state or second state, the screw 243 can be easily coupled only in the two states.

Figure 24:
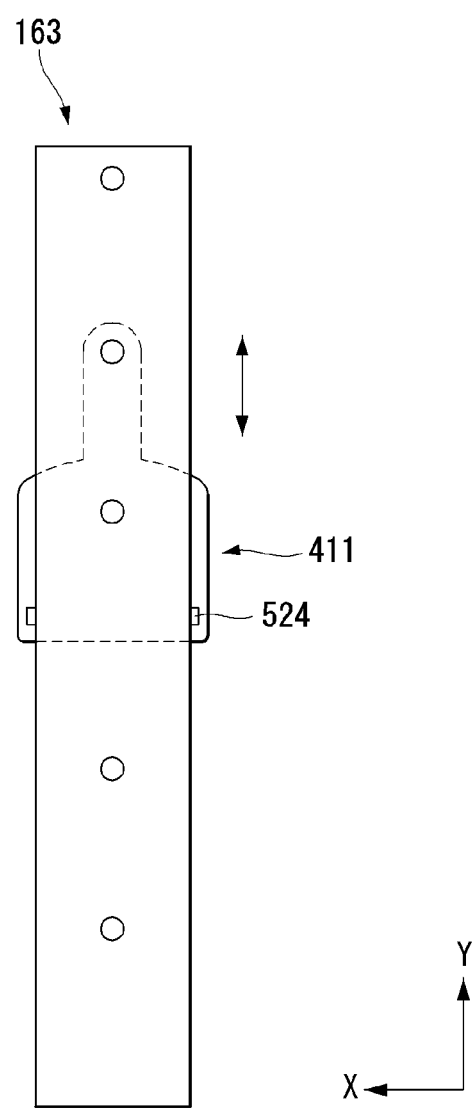

Referring to FIGS. 23 and 24, the sliding member 411 may include a side guide 513 and a guide protruding part 524 for accurately guiding the locking bracket, which are provided to the lower part of the sliding member 411.

The side guide 513 can be extended from both sides of the sliding member 411. The extended width of the side guide 513 may be greater than the width of the locking bracket 163. The guide protruding part 524 may be provided to both sides of the side guide 513. The guide protruding part 524 may protrude in the same direction as the protruding direction of the locking part 436 of the sliding member 411. The guide protruding part 524 may protrude lower than the locking part 436. However, the present invention is not limited thereto and the guide protruding part 524 may protrude higher than the locking part 436.

The distance GD between the guide protruding parts 524 formed at both sides of the side guide 513 may be identical to or greater than the width of the locking bracket 163. Accordingly, the locking bracket 163 can be disposed between the guide protruding parts 524.

The guide protruding parts 524 can guide the locking bracket 163 such that the locking bracket 163 does not laterally tilt when the locking bracket 163 moves to be in one of the first state and the second state.

Figure 25:
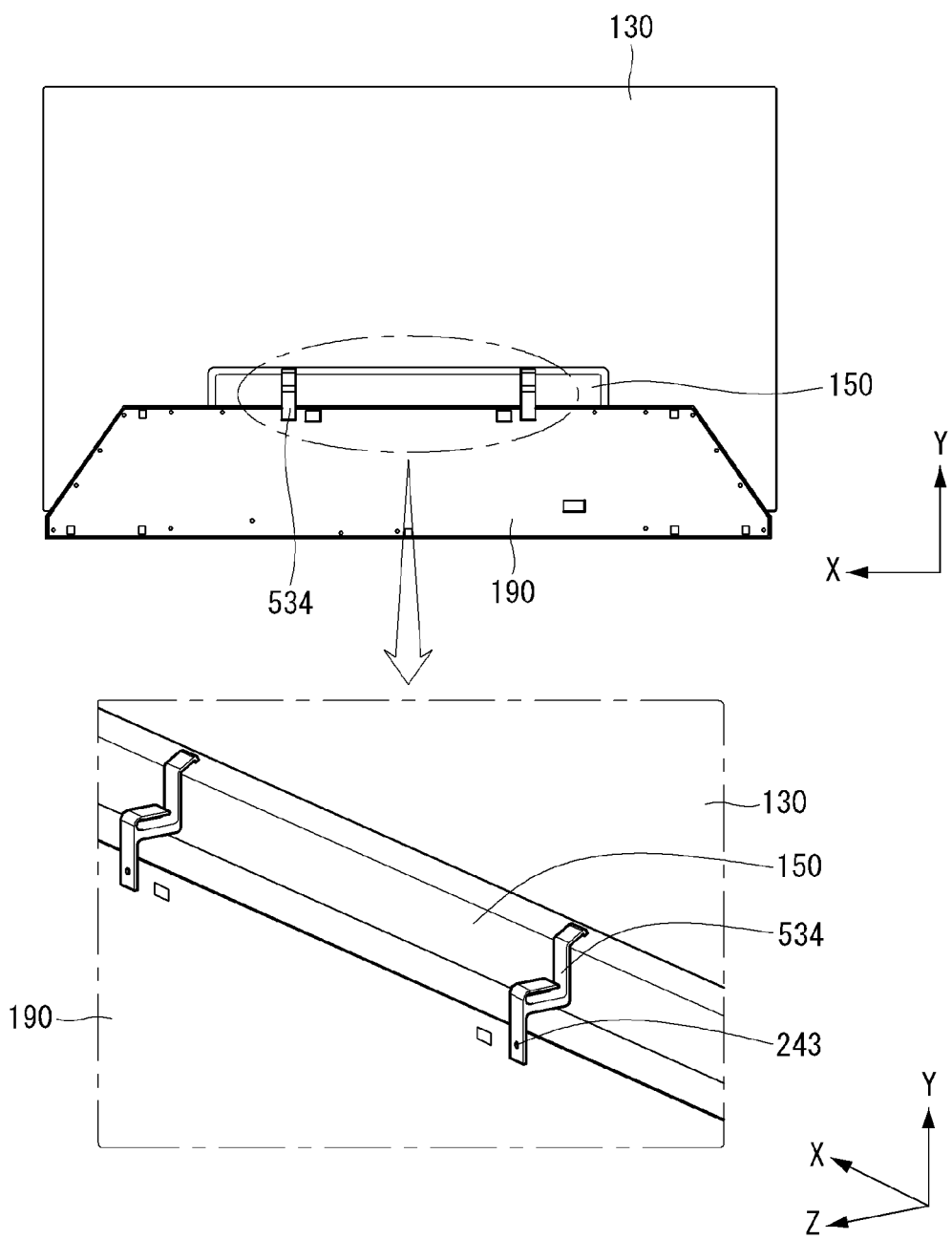

Referring to FIG. 25, the display device 10 according to the present invention may include fixing brackets 534 for coupling the first housing 150 and the second housing 190 in the second state.

The fixing brackets 534 may be provided to both sides of the first and second housings 150 and 190. The fixing brackets 534 can fix the first and second housings 150 and 190 such that the second housing 190 contacts the rear side of the first housing 150 without using the wall-mounting assembly. One end of the fixing bracket 534 can be coupled to the first housing 150 and the other end thereof can be coupled to the second housing 190. When the distance between one end and the other end of the fixing bracket 534 increases, the first housing 150 and the second housing 190 may not be fixed. Accordingly, the fixing bracket 534 may be made of a rigid material, for example, a metal.

In the display device 10 according to the present invention, the fixing brackets 534 can fix the first housing 150 and the second housing 190 in the second state. Accordingly, risk of separation of the first housing 150 from the second housing 190 and generation of cracks or damage therein in the second state can be decreased.

Figure 26:
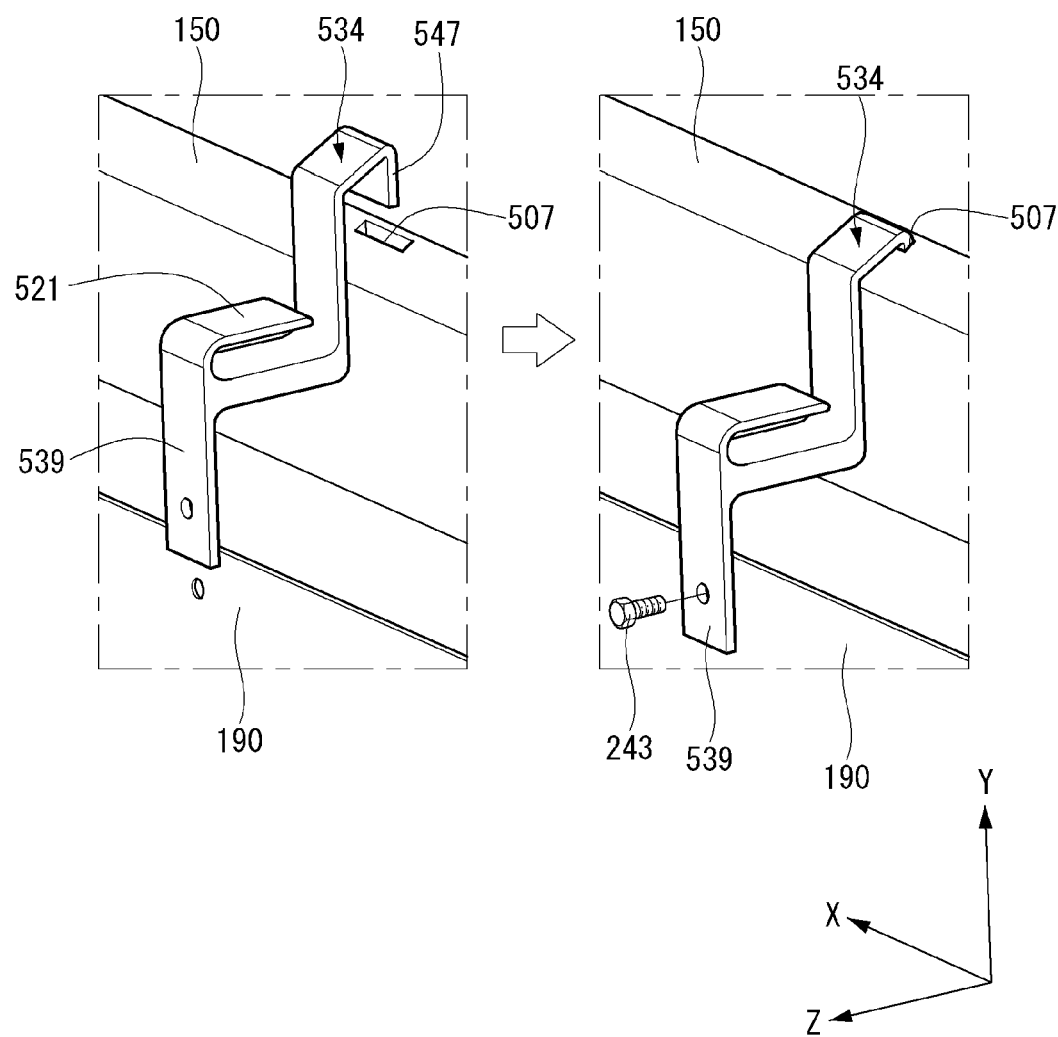

Referring to FIGS. 26 and 27, the fixing bracket 534 may include first and second protruding portions 547 and 539 and a hanger 521.

The first protruding portion 547 may form one end of the fixing bracket. The first protruding portion 547 can be bent in a direction perpendicular to the body of the fixing bracket 534. For example, when the body of the fixing bracket 534 is extended in the horizontal direction, the first protruding portion 547 can be bent in the vertical direction.

One end of the first protruding portion 547 may be bent in a direction opposite the direction in which the first protruding portion 547 is extended. That is, one end of the first protruding portion 547 may be vertically bent downward. Since one end the first protruding portion 547 is bent, the fixing bracket 534 can be easily inserted into the first housing 150.

One end of the first protruding portion 547 may be inserted into a fixing hole 507 formed at both sides of the top end of the first housing 150. The first protruding portion 547 may need only a force in the vertical direction to couple the first housing 150 and the second housing 190 in the second state. Accordingly, the first protruding portion 547 can fix the first housing 150 and the second housing 190 without being coupled to the first housing through a screw.

The second protruding portion 539 may form the other end of the fixing bracket. The second protruding portion 539 can be bent in a direction perpendicular to the body of the fixing bracket 534. For example, when the body of the fixing bracket 534 is extended in the horizontal direction, the second protruding portion 539 can be extended in the vertical direction.

The second protruding portion 539 may contact at least one surface of the second housing 190 in the second state. The second protruding portion 539 may be coupled to the second housing 190 through the screw 243 in the second state. Since the second protruding portion 539 and the second housing 190 are coupled through the screw 243, the first housing 150 and the second housing 190 can be firmly fixed with respect to each other.

The hanger 521 may be extended in the same direction as the body of the fixing bracket 534. The hanger 521 may be a part on which an electrical wire hangs. When an electrical wire hangs on the hanger 521, the user can easily arrange wires and the display device can have a neat appearance. However, the present invention is not limited thereto and the fixing bracket 534 may not include the hanger 521, as shown in FIG. 27(b). In this case, the manufacturing process of the fixing bracket 534 can be simplified and manufacturing costs can be reduced.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device, comprising:
a display panel;
a back cover provided to a rear side of the display panel;
a first housing provided to a rear side of the back cover;
a hinge having one side connected to the first housing; and
a second housing connected to the other side of the hinge;
wherein the hinge comprises:
a hinge bar having a hole on a peripheral surface;
a first part connected to the hinge bar and the first housing;
a second part connected to the second housing and rotatable around the hinge bar; and
an adjustment part provided to the second part, the adjustment part engaged with or released from the hole according to rotation of the second part.

2. The display device of claim 1, wherein the second housing changes from at least one of a first state in which the second housing is extended in a direction perpendicular to the first housing and a second state in which at least one side of the second housing is extended in parallel with the rear side of the first housing to the other state, according to rotation of the hinge.

3. The display device of claim 2, wherein the first state is a standing state and the second state is a wall-mounted state.

4. The display device of claim 2, wherein the hinge includes a first part and a second part covering at least part of the first part.

5. The display device of claim 4, wherein the second part rotates around the first part when the first state changes to the second state.

6. The display device of claim 4, wherein the second part rotates around the first part counterclockwise when the first state changes to the second state.

7. The display device of claim 4, wherein the second part is extended in parallel with the first part in the first state and extended in a direction perpendicular to the first part in the second state.

8. The display device of claim 4, wherein the first part is coupled to the first housing and the second part is coupled to the second housing.

9. The display device of claim 4, wherein the first part includes a cylindrical hinge bar disposed at a region coupled to the second part, and the second part rotates about the hinge bar.

10. The display device of claim 9, wherein the adjustment part includes an inserted part,
wherein the inserted part is inserted into the hole bar in the first state and separated from the hole in the second state.

11. The display device of claim 10, wherein the inserted part is separated from the hole as a spring inserted into the second part contracts, when the first state changes to the second state.

12. The display device of claim 9, wherein the second part includes a rail part protruding to the side thereof and provided to one end thereof,
wherein the rail part is inserted into a guide groove formed in the hinge bar, the guide groove having a diameter greater than other portions of the hinge bar.

13. The display device of claim 12, wherein the guide groove is formed in the direction of the front side of the hinge bar between 0 to 90 degrees counterclockwise.

14. The display device of claim 2, wherein the hinge includes a first hinge and a second hinge respectively coupled to both sides of the second housing.

15. The display device of claim 2, wherein at least part of the hinge includes a convexo-concave part.

16. The display device of claim 2, further comprising a through bolt for simultaneously coupling and fixing the first housing and the second housing in the first state.

17. The display device of claim 16, wherein the through bolt includes a first screw region and a second screw region having different diameters.

18. The display device of claim 17, wherein the first screw region engages with at least one hole of the second housing and the second screw region engages with at least one hole of the first housing.

19. The display device of claim 2, further comprising a locking bracket for simultaneously coupling and fixing the first housing and the second housing in the second state.

20. The display device of claim 2, wherein the hinge includes a metal material.

* * * * *